(12) United States Patent
Morishita et al.

(10) Patent No.: US 9,369,103 B2
(45) Date of Patent: Jun. 14, 2016

(54) VARIABLE GAIN MULTISTAGE AMPLIFIER AND RECEIVER

(71) Applicant: Panasonic Corporation, Osaka (JP)

(72) Inventors: Yohei Morishita, Kanagawa (JP); Ryo Kitamura, Kanagawa (JP); Noriaki Saito, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/626,938

(22) Filed: Feb. 20, 2015

(65) Prior Publication Data

US 2015/0249437 A1   Sep. 3, 2015

(30) Foreign Application Priority Data

Mar. 3, 2014   (JP) .................................. 2014-040452

(51) Int. Cl.
| | |
|---|---|
| *H04B 1/03* | (2006.01) |
| *H03G 3/30* | (2006.01) |
| *H03F 3/193* | (2006.01) |
| *H03F 1/02* | (2006.01) |
| *H03F 1/22* | (2006.01) |
| *H03F 3/21* | (2006.01) |
| *H03G 1/00* | (2006.01) |

(52) U.S. Cl.
CPC ............ *H03G 3/3036* (2013.01); *H03F 1/0261* (2013.01); *H03F 1/223* (2013.01); *H03F 3/193* (2013.01); *H03F 3/211* (2013.01); *H03G 1/0023* (2013.01); *H03F 2200/24* (2013.01); *H03F 2200/405* (2013.01); *H03F 2200/451* (2013.01); *H03F 2200/534* (2013.01); *H03F 2200/537* (2013.01); *H03F 2200/541* (2013.01)

(58) Field of Classification Search
CPC .............................. H03F 1/223; H03F 3/45188
USPC ......... 455/127.2, 127.3, 253.2, 341; 330/133, 330/253, 254
See application file for complete search history.

(56) References Cited

U.S. PATENT DOCUMENTS

| | | | |
|---|---|---|---|
| 7,321,266 B2 * | 1/2008 | Chiang | .................... H03F 1/223 330/254 |
| 7,701,289 B2 * | 4/2010 | Kuo | .................... H03F 3/45188 330/133 |
| 2003/0151461 A1 | 8/2003 | Arayashiki et al. | |
| 2006/0071712 A1 | 4/2006 | Lee | |

FOREIGN PATENT DOCUMENTS

| | | |
|---|---|---|
| JP | 2003-234629 | 8/2003 |
| JP | 2006-109409 | 4/2006 |

* cited by examiner

*Primary Examiner* — Sonny Trinh
(74) *Attorney, Agent, or Firm* — Greenblum & Bernstein, P.L.C.

(57) ABSTRACT

There is provided a variable gain multistage amplifier including: an input terminal to which the input signal is input; multistage amplifiers amplify the input signal, the multistage amplifiers being connected in series; and an output terminal that outputs the amplified signal, and
the multistage amplifiers include one or more successive cascode amplifiers, one of which is in final stage.

11 Claims, 16 Drawing Sheets

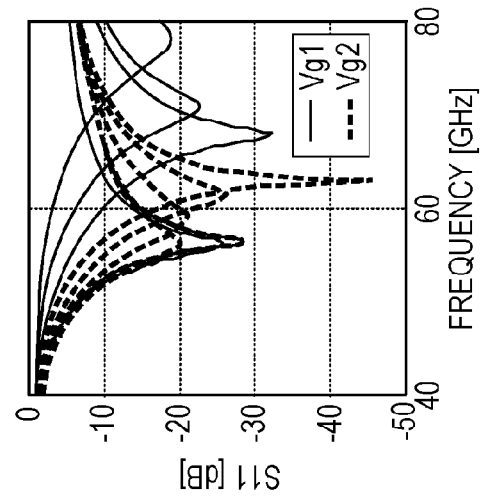
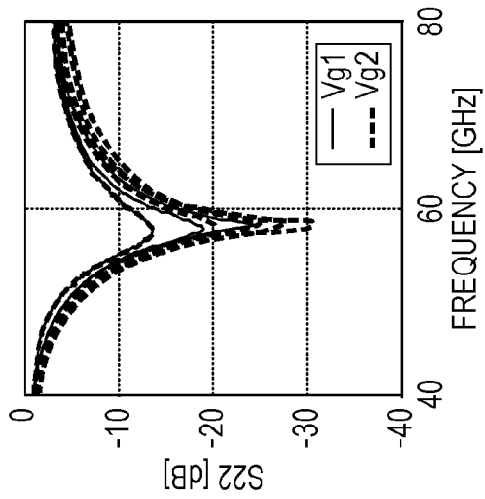
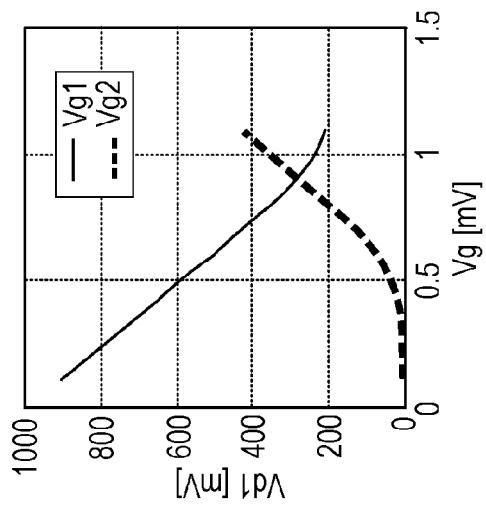
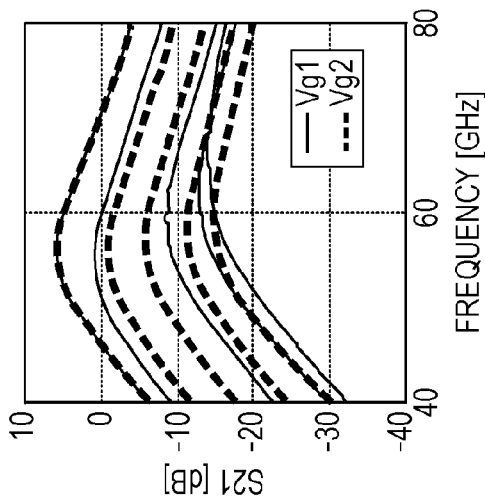
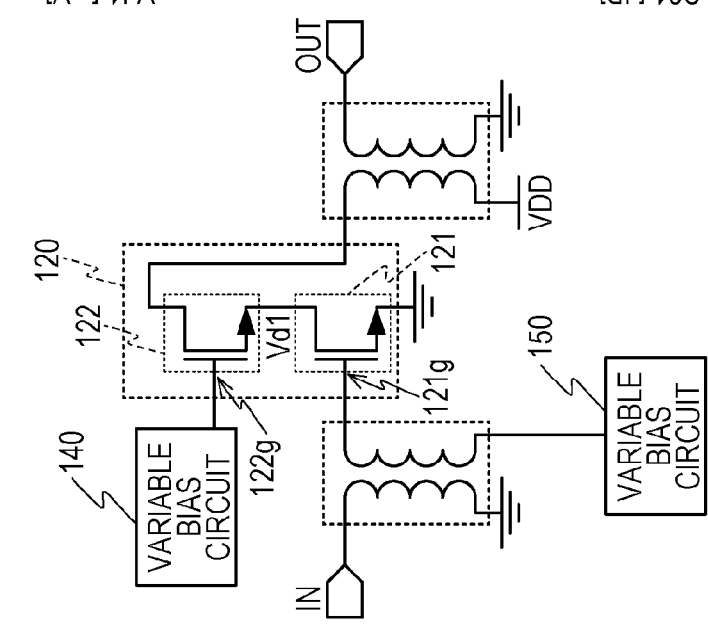

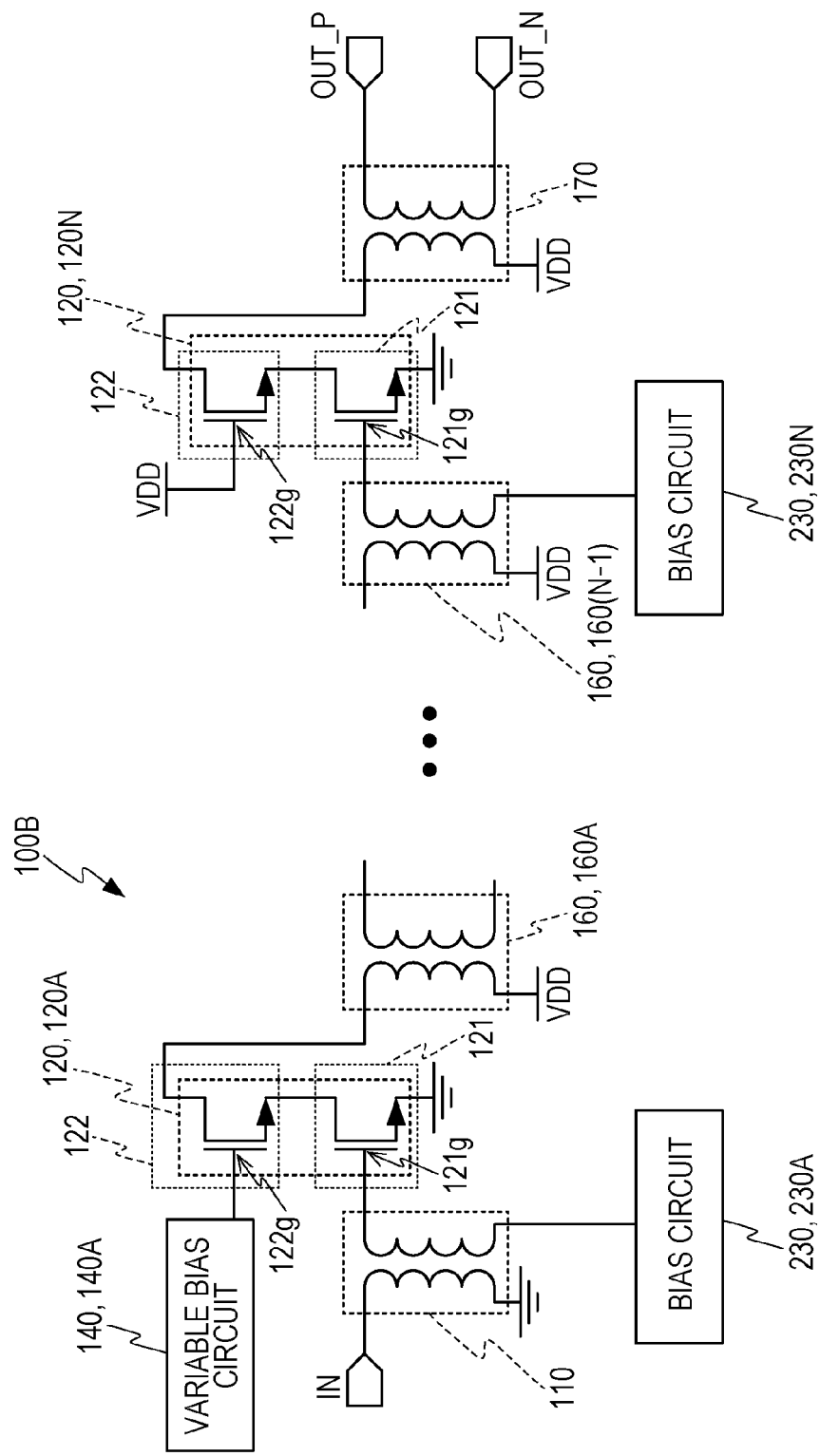

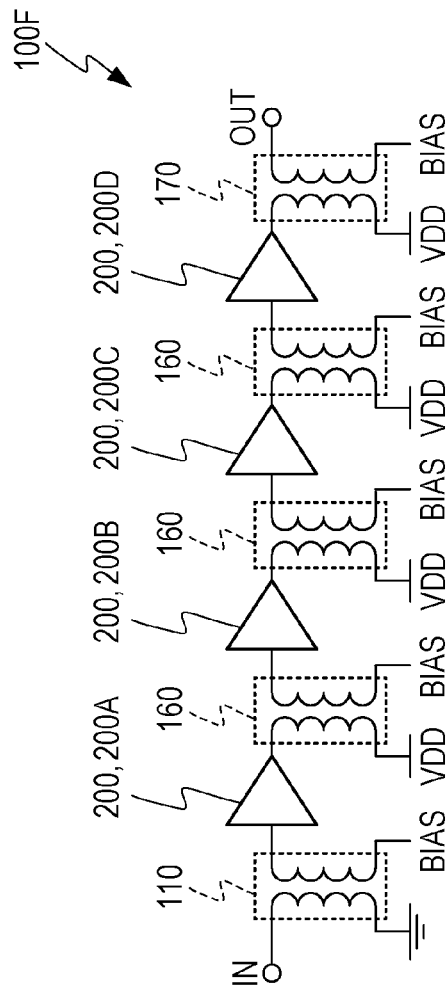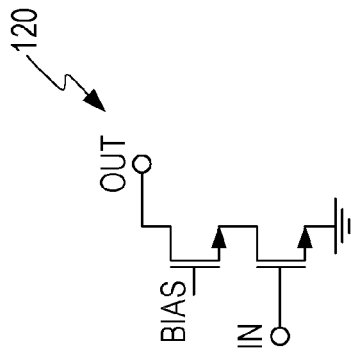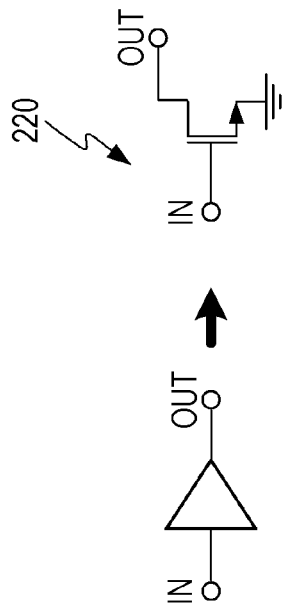

VARIABLE GAIN MULTISTAGE AMPLIFIER AND RECEIVER

BACKGROUND

1. Technical Field

The present disclosure relates to variable gain multistage amplifiers and receivers.

2. Description of the Related Art

In the past, as a low noise amplifier (LNA), a variable gain amplifier that can change the gain at the time of amplification of a signal has been known.

As the existing variable gain amplifier, a variable gain amplifier provided with a first cascode amplifier, a second cascode amplifier, and a gain adjusting section has been known. The first cascode amplifier includes a first common source transistor and a first common gate transistor. The second cascode amplifier makes a differential pair with the first cascode amplifier and includes a second common source transistor and a second common gate transistor.

The gain adjusting section has one end connected to the drain of the second common source transistor and the source of the second common gate transistor and the other end connected to the drain of the second common source transistor and the source of the second common gate transistor. Moreover, the gain adjusting section includes a transistor pair that is opened and closed by a control bias voltage and a resistance (see, for example, Japanese Unexamined Patent Application Publication No. 2006-109409).

Furthermore, a variable gain amplifier of Japanese Unexamined Patent Application Publication No. 2006-109409 performs gain adjustment by changing the impedance between differentials.

Moreover, the existing variable gain amplifier is provided with an amplifying element, a load, an output terminal, a bias circuit, a variable current source, a gain detecting circuit, and a direct-current output voltage detecting circuit. The amplifying element includes a control electrode, a grounding electrode, and an output electrode. The load is connected to the output electrode of the amplifying element. The output terminal is formed at a connecting point between the output electrode of the amplifying element and the load.

The bias circuit is connected to the control electrode and is a circuit for controlling the gain of the amplifying element. The variable current source is connected to the output electrode and is a power supply for controlling the direct-current output voltage at the output terminal. The gain detecting circuit is connected to the output terminal and detects the gain of the amplifying element. The direct-current output voltage detecting circuit is connected to the output terminal and detects a direct-current output voltage. Moreover, the bias circuit is controlled by the output of the gain detecting circuit. The variable current source is controlled by the output of the direct-current output voltage detecting circuit (see, for example, Japanese Unexamined Patent Application Publication No. 2003-234629).

Furthermore, the variable gain amplifier of Japanese Unexamined Patent Application Publication No. 2003-234629 changes the gain by control of the gate potential of the source grounding amplifier circuit.

SUMMARY

In the variable gain amplifiers of Japanese Unexamined Patent Application Publications Nos. 2006-109409 and 2003-234629, the performance (for example, frequency characteristics, noise figure (NF), linearity, and high voltage tolerance) of the amplifier is degraded due to the gain control of the amplifier.

One non-limiting and exemplary embodiment provides a variable gain multistage amplifier and a receiver, the variable gain multistage amplifier that can suppress degradation of the performance of an amplifier and control the gain of the amplifier.

In one general aspect, the techniques disclosed here feature a variable gain multistage amplifier including: an input terminal to which the input signal is input; multistage amplifiers amplify the input signal, the multistage amplifiers being connected in series; and an output terminal that outputs the amplified signal, wherein the multistage amplifiers include one or more successive cascode amplifiers, one of which is in final stage.

According to the present disclosure, it is possible to suppress degradation of the performance of an amplifier and control the gain of the amplifier.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3A is a diagram for simulating each parameter of a cascode amplifier according to the first embodiment;

FIG. 3B is diagram depicting an example of the simulation result of an Vd1 parameter of the cascode amplifier according to the first embodiment;

FIG. 3C is diagram depicting an example of the simulation result of an S11 parameter of the cascode amplifier according to the first embodiment;

FIG. 3D is diagram depicting an example of the simulation result of an S21 parameter of the cascode amplifier according to the first embodiment;

FIG. 3E is diagram depicting an example of the simulation result of an S22 parameter of the cascode amplifier according to the first embodiment;

FIG. 6 is a diagram depicting a first configuration example of a variable gain amplifier according to a second embodiment;

FIG. 13A is a diagram depicting a configuration example of a variable gain amplifier according to a fifth embodiment;

FIG. 13B is a diagram depicting a first configuration example of an amplifier included in the variable gain amplifier according to the fifth embodiment;

FIG. 13C is a diagram depicting a second configuration example of the amplifier included in the variable gain amplifier according to the fifth embodiment;

DETAILED DESCRIPTION

Hereinafter, embodiments of the present disclosure will be described by using the drawings.
(Underlying Knowledge Forming Basis of the Present Disclosure)

In a variable gain amplifier of Japanese Unexamined Patent Application Publication No. 2006-109409, the parasitic capacity and the resistance of a transistor switch are added to a signal path. Since the parasitic capacity and the resistance hinder high-speed operation, in a high-frequency circuit (for example, a circuit for millimeter-wave communication) using the parasitic capacity and the resistance, for example, the gain is reduced due to a mismatch.

In a variable gain amplifier of Japanese Unexamined Patent Application Publication No. 2003-234629, with a change in the gate potential of a source grounding amplifier circuit, a mismatch occurs in an input of a transistor, and the characteristics (for example, frequency characteristics, gain characteristics, and noise figure (NF)) of an amplifier are degraded. The degradation of the characteristics of the amplifier becomes pronounced in a high-frequency circuit using the amplifier, for example.

Moreover, in a variable gain amplifier, in a multistage configuration in which amplifiers are connected in multiple stages, as a result of amplification being sequentially performed in the amplifiers, the signal amplitude sometimes becomes more than or equal to a predetermined amplitude in the amplifier in a subsequent stage and exceeds a high voltage. The high voltage refers to, for example, a voltage value at which the life of a transistor is insured.

Furthermore, it is preferable that a receiver including the variable gain amplifier can perform communication in a state in which the receiver is close to a communication target device (for example, at a distance of 3 mm therefrom) and can perform communication in a state in which the receiver is far away from the communication target device (for example, at a distance of 10 m therefrom).

Since the communication distance between the receiver and the communication target device varies greatly, it is difficult to perform control of the gain. For example, if the variable gain amplifier is designed based on the communication in a state in which the receiver and the communication target device are close to each other, it becomes difficult to satisfy a necessary signal-noise ratio (SNR). Moreover, for example, if the variable gain amplifier is designed based on the communication in a state in which the receiver and the communication target device are far away from each other, a voltage which is applied to the transistor of the variable gain amplifier sometimes exceeds a high voltage.

In the following embodiments, a variable gain multistage amplifier and a receiver, the variable gain multistage amplifier that can suppress degradation of the performance of an amplifier and control the gain of the amplifier, will be described.

First Embodiment

Figure 1:
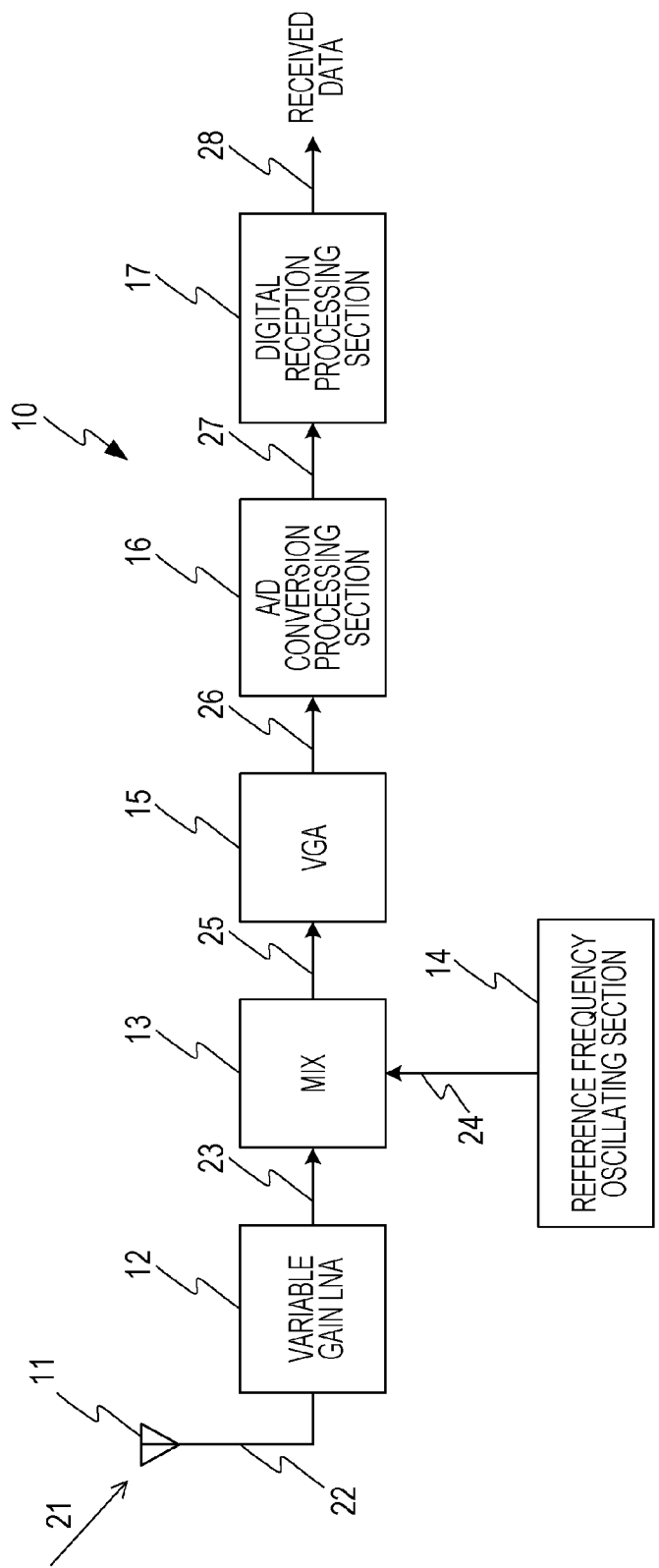
FIG. 1 is a diagram depicting a configuration example of a receiver according to a first embodiment.

FIG. 1 is a diagram depicting a configuration example of a variable gain receiver 10 according to a first embodiment. The variable gain receiver 10 has an antenna 11, a variable gain low noise amplifier (LNA) 12, a mixer circuit (MIX) 13, a reference frequency oscillating section 14, a baseband variable gain amplifier (VGA) 15, an analog to digital (A/D) conversion processing section 16, and a digital reception processing section 17.

The variable gain receiver 10 receives an electromagnetic wave 21 transmitted by using a carrier frequency $f_{RF}$ and performs gain control and filter processing on the received signal and thereby extracts a signal component. The variable gain receiver 10 converts the extracted signal component into a digital signal, performs digital reception processing on the digital signal obtained by conversion, and outputs received data 28 subjected to digital reception processing.

The antenna 11 receives the electromagnetic wave 21 transmitted from a transmission station (not depicted in the drawing) by using the carrier frequency $f_{RF}$ and converts the received signal into an analog radio frequency (RF) signal 22.

The variable gain low noise amplifier 12 amplifies the analog RF signal 22 from the antenna 11 and outputs the resultant signal. That is, the analog RF signal 22 is an example of an input signal to be amplified. Moreover, the variable gain low noise amplifier 12 is an example of a variable gain multistage amplifier.

The mixer circuit 13 performs discrete-time frequency conversion on an analog RF signal 23 by using the analog RF signal 23 obtained by amplification and a reference frequency signal 24 and outputs a baseband signal 25. Incidentally, the mixer circuit 13 may output an intermediate frequency (IF) signal in place of the baseband signal 25. The mixer circuit 13 is an example of a frequency converting section.

The reference frequency oscillating section 14 generates the reference frequency signal 24 used for frequency conversion processing performed by the mixer circuit 13 and outputs the reference frequency signal 24 to the mixer circuit 13.

The baseband variable gain amplifier 15 performs gain adjustment and filter processing on the baseband signal 25 and outputs a baseband signal 26.

The A/D conversion processing section 16 quantizes the input baseband signal 26 into a digital value by using a predetermined sampling frequency and outputs a digital baseband signal 27 obtained by the conversion.

The digital reception processing section 17 performs predetermined digital reception processing (for example, demodulation processing, decoding processing) on the digital baseband signal 27 input thereto and outputs received data 28 thus obtained. The digital reception processing section 17 is an example of a signal processing section.

Next, a configuration example of the variable gain low noise amplifier 12 will be described.

Figure 2:
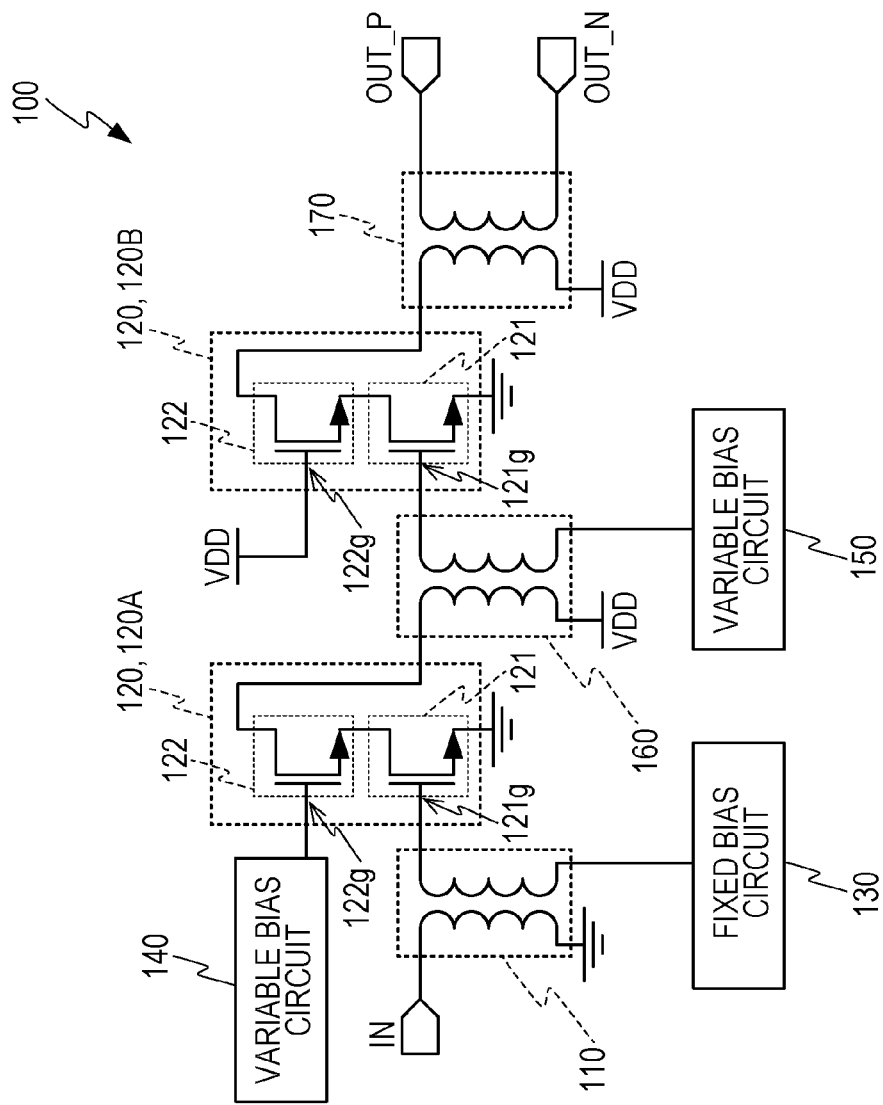
FIG. 2 is a diagram of a variable gain amplifier according to the first embodiment.

FIG. 2 is a diagram depicting a configuration example of a variable gain amplifier 100. The variable gain amplifier 100 is part or the whole of the variable gain low noise amplifier 12. The variable gain amplifier 100 is used in, for example, a microwave circuit or a millimeter-wave circuit.

The variable gain amplifier 100 has an input matching circuit 110, a cascode amplifier (a cascode amplifier circuit) 120, a fixed bias circuit 130, a variable bias circuit 140, a variable bias circuit 150, an intermediate matching circuit 160, and an output matching circuit 170.

In FIG. 2, the cascode amplifier 120 includes a first cascode amplifier 120A and a second cascode amplifier 120B. In a common description of the cascode amplifiers 120A and 120B, the cascode amplifiers 120A and 120B will be referred to as the cascode amplifier 120.

The cascode amplifier 120 includes a plurality of transistors in cascode connection. Specifically, the cascode amplifier 120 includes a cascode first transistor 121 and a cascode second transistor 122.

Incidentally, a gate $121g$ of the cascode first transistor 121 will be referred to also as a "first gate". A gate $122g$ of the cascode second transistor 122 will be referred to also as a "second gate". In FIG. 2, the cascode first transistor 121 is disposed on the lower side and is included in a source grounding circuit. In FIG. 2, the cascode second transistor 122 is disposed on the upper side and is included in a gate grounding circuit.

The cascode first transistor 121 is an example of a first transistor, and the cascode second transistor 122 is an example of a second transistor. The first gate $121g$ and the second gate $122g$ are each an example of a control input terminal of a transistor.

The fixed bias circuit 130 is a circuit that generates a fixed (invariant) bias voltage which is applied to the first gate $121g$. The variable bias circuit 140 is a circuit that generates a variable bias voltage which is applied to the first gate $121g$. The variable bias circuit 150 is a circuit that generates a variable bias voltage which is applied to the second gate $122g$. The variable bias circuit 150 is an example of a bias voltage controlling section that controls a bias voltage.

Next, an operation example of the variable gain amplifier 100 will be described.

The high-frequency input signal input from the antenna 11 (see FIG. 1) is input to the first cascode amplifier 120A via the input matching circuit 110. The input matching circuit 110 performs impedance conversion such that the input impedance of the first cascode amplifier 120A becomes the complex conjugate value of the output impedance of the antenna 11.

The signal input to the first gate $121g$ of the first cascode amplifier 120A is amplified by the first cascode amplifier 120A. The amplified signal is output to the drain of the cascode second transistor 122 of the first cascode amplifier 120A.

The high-frequency signal output from the drain of the cascode second transistor 122 of the first cascode amplifier 120A is input to the first gate $121g$ of the second cascode amplifier 120B via the intermediate matching circuit 160. The intermediate matching circuit 160 performs impedance conversion such that the input impedance of the second cascode amplifier 120B becomes the complex conjugate value of the output impedance of the first cascode amplifier 120A. That is, the intermediate matching circuit 160 performs matching between the output impedance (on the previous stage's side) and the input impedance (on the subsequent stage's side) of the adjacent cascode amplifiers 120.

The signal input to the first gate $121g$ of the second cascode amplifier 120B is amplified by the second cascode amplifier 120B. The amplified signal is output to the drain of the cascode second transistor 122 of the second cascode amplifier 120B.

The high-frequency signal output from the drain of the cascode second transistor 122 of the second cascode amplifier 120B is input to the mixer circuit 13 (see FIG. 1) via the output matching circuit 170. The output matching circuit 170 performs impedance conversion such that the output impedance of the second cascode amplifier 120B becomes the complex conjugate value of the input impedance of the mixer circuit 13.

Next, a method for designing the variable gain amplifier 100 will be described.

For example, first, the variable gain amplifier 100 near a sensitivity point in the case of the greatest distance between the variable gain receiver 10 and a transmitter (not depicted in the drawing) will be described. The sensitivity point refers to minimum received power which allows the variable gain receiver 10 to perform communication. Each circuit in the variable gain amplifier 100 is designed in such a way that the gain, the deviation in band, and the noise factor of the variable gain amplifier 100 meet predetermined standards (the variable gain amplifier 100 has the communication performance specified in the standards and has the communication performance required as a product) (the design of a high-gain mode).

Moreover, as a result of the variable gain receiver 10 and the transmitter getting closer to each other, the SNR of the variable gain receiver 10 meets a predetermined standard. The variable gain amplifier 100 may transition to a low-gain mode in order to increase distortion and high voltage tolerance of the variable gain amplifier 100. When the variable gain amplifier 100 transitions to a low-gain mode, as the low-gain mode, there may be a plurality of stages of modes with different gains.

Incidentally, switching between the high-gain mode and the low-gain mode changes in accordance with, for example, the magnitude of the bias voltage which is generated by the variable bias circuits 140 and 150. For example, the mode becomes the high-gain mode at a high bias voltage and becomes the low-gain mode at a low bias voltage.

The variable gain amplifier 100 maintains the high-gain mode as long as possible, for example, and, if the distortion or the high voltage tolerance reaches a limit in the high-gain mode, switches the mode to the low-gain mode. In the low-gain mode, the variable gain amplifier 100 is required to set the gain to a gain that meets a predetermined SNR and can ensure a necessary SNR at a gain switching point, for example, and withstand a high input voltage.

In the variable gain amplifier 100 depicted in FIG. 2, two cascode amplifiers 120 are connected in series. Of the plurality of cascode amplifiers 120, in the first cascode amplifier 120A located on the input side, a potential Vg2 of the second gate $122g$ is adjusted and, in the second cascode amplifier 120B located on the output side, a potential Vg1 of the first gate $121g$ is adjusted. This makes it possible to suppress degradation of the performance of the amplifier and adjust the gain of the variable gain amplifier 100.

Here, the gain adjustment performed by the first gate 121g and the second gate 122g of the cascode amplifier 120 will be described.

First, the gain adjustment performed by the first gate 121g will be described. When the variable gain amplifier 100 reduces the gain of the cascode amplifier 120 by lowering the potential Vg1 of the first gate 121g, the gate-source capacity of the cascode first transistor 121 changes with a reduction in gain and a mismatch occurs on the input side of the cascode amplifier 120.

On the other hand, since a change in the drain-source voltage of the cascode first transistor 121 for gain reduction is small, a signal voltage is rarely applied disproportionally to any one of the cascode first transistor 121 and the cascode second transistor 122. The rather even state of the signal voltage means that the high voltage tolerance of the cascode amplifier 120 is high.

Moreover, since the current flowing through the cascode amplifier 120 decreases greatly for the lowering of the potential Vg2 of the first gate 121g, it is possible to reduce the consumption current of the cascode amplifier 120 with reduction in gain.

Next, the gain adjustment performed by the second gate 122g will be described. The variable gain amplifier 100 reduces the gain of the cascode amplifier 120 by lowering the potential Vg2 of the second gate 122g. The amount of change of the gate-source capacity of the cascode first transistor 121 with reduction in gain is relatively small. As compared to the adjustment performed by the first gate 121g, the degree of a mismatch that occurs on the input side of the cascode amplifier 120 is small.

On the other hand, in the variable gain amplifier 100, since the drain-source voltage of the cascode first transistor 121 decreases with reduction in the gain of the cascode amplifier 120, the most of the signal voltage is applied disproportionally to the cascode second transistor 122. The state in which the signal voltage is applied disproportionally, that is, the rather uneven state of the signal voltage means that the high voltage tolerance of the cascode amplifier 120 is low.

In the variable gain amplifier 100, with the gain adjustment performed by the first gate 121g, as compared to the gain adjustment performed by the second gate 122g, although degradation of matching on the input side of the cascode amplifier 120 is caused, it is possible to make the cascode amplifier 120 achieve a power saving and improve the high voltage tolerance of the cascode amplifier 120. Moreover, in the variable gain amplifier 100, with the gain adjustment performed by the second gate 122g, as compared to the gain adjustment performed by the first gate 121g, although degradation of the high voltage tolerance of the cascode amplifier 120 is caused, it is possible to suppress degradation of matching on the input side of the cascode amplifier 120.

FIGS. 3A to 3E are diagrams, each depicting an example of the simulation result of S parameters of the one-stage cascode amplifier 120 on which input-output matching is performed by a transformer. Here, the drain voltage of the cascode first transistor 121 is assumed to be Vd1.

In FIG. 3B, a characteristic C1 represents the voltage Vd1 observed when the potential Vg1 of the first gate 121g is adjusted. A characteristic C2 represents the voltage Vd1 observed when the potential Vg2 of the second gate 122g is adjusted.

In FIG. 3B, if the potential Vg1 of the first gate 121g is adjusted (at 0 to 1 mV, for example), since the voltage Vd1 can maintain a predetermined potential (for example, 200 mV) and the voltage Vd1 becomes more than or equal to the potential Vg1, the voltage applied to the cascode second transistor 122 is low. On the other hand, if the potential Vg2 of the second gate 122g is adjusted, since it is difficult for the voltage Vd1 to maintain the predetermined potential and the potential Vg2 becomes less than or equal to the voltage Vd1, a high voltage is applied to the cascode second transistor 122.

FIG. 3C is a diagram depicting an S11 parameter which is one of the S parameters of the cascode amplifier 120. The S11 parameter represents the impedance on the input side of each transistor included in the cascode amplifier 120 and represents a reflection coefficient observed when the cascode amplifier 120 is viewed from an input terminal (IN).

In FIG. 3C, a characteristic indicated by a solid line represents an example of the relationship between the frequency and the S11 parameter observed when the potential Vg1 of the first gate 121g is adjusted, and a plurality of different characteristics, each being indicated by a solid line, represent cases where the potential Vg1 is changed. In FIG. 3C, a characteristic indicated by a dotted line represents an example of the relationship between the frequency and the S11 parameter observed when the potential Vg2 of the second gate 122g is adjusted, and a plurality of different characteristics, each being indicated by a dotted line, represent cases where the potential Vg2 is changed.

In the adjustment of the potential Vg2 of the second gate 122g, the S11 parameter maintains a value which is less than or equal to −10 dB in a wide frequency range near 57 to 65 GHz which is used by WiGig. On the other hand, in the adjustment of the potential Vg1 of the first gate 121g, if the gain of the first gate 121g is reduced, there is a frequency range in which the value becomes more than or equal to −10 dB.

That is, in the variable gain amplifier 100, if the potential Vg1 of the first gate 121g is adjusted, impedance matching on the input side of the cascode amplifier 120 is degraded. Moreover, in the variable gain amplifier 100, if the potential Vg2 of the second gate 122g is adjusted, it is possible to suppress degradation of impedance matching on the input side of the cascode amplifier 120.

FIG. 3D is a diagram depicting an S21 parameter which is one of the S parameters of the cascode amplifier 120 in the variable gain amplifier 100. The S21 parameter represents a gain characteristic of each transistor included in the cascode amplifier 120.

In FIG. 3D, characteristics indicated by solid lines each represent an example of the relationship between the frequency and the S21 parameter of each of the values of the potential Vg1 of the first gate 121g and are characteristics (solid lines) that differ from one value of the potential Vg1 to another. In FIG. 3D, characteristics indicated by dotted lines each represent an example of the relationship between the frequency and the S21 parameter of each of the values of the potential Vg2 of the second gate 122g and are characteristics (dotted lines) that differ from one value of the potential Vg2 to another.

In FIG. 3D, the gain is maximized near a frequency of 60 GHz. Therefore, by using the cascode amplifier 120, it is possible to receive a signal in a millimeter-wave band of 60 GHz, for example, with high sensitivity.

FIG. 3E is a diagram depicting an S22 parameter which is one of the S parameters of the cascode amplifier 120. The S22 parameter represents a reflection coefficient observed when the cascode amplifier 120 is viewed from an output terminal (OUT).

In FIG. 3E, characteristics indicated by solid lines each represent an example of the relationship between the frequency and the S22 parameter of each of the values of the potential Vg1 of the first gate 121g and are characteristics (solid lines) that differ from one value of the potential Vg1 to another. In FIG. 3E, characteristics indicated by dotted lines each represent an example of the relationship between the frequency and the S22 parameter of each of the values of the potential Vg2 of the second gate 122g and are characteristics (dotted lines) that differ from one value of the potential Vg2 to another.

As for the S22 parameter, in the adjustments of the potential Vg1 of the first gate 121g and the potential Vg2 of the second gate 122g, the value of the characteristic becomes small near 60 GHz, which reveals that there are not a lot of variations in the characteristics and the degradation of matching is not significant.

In FIG. 2, in the variable gain amplifier 100, the variable bias circuit 150 is connected to the second gate 122g of the first cascode amplifier 120A and the variable bias circuit 140 is connected to the first gate 121g of the second cascode amplifier 120B.

For example, by adjusting the potential Vg2 of the second gate 122g and reducing the gain of the first cascode amplifier 120A, the first cascode amplifier 120A can be matched suitably with the antenna 11 (see FIG. 1).

Moreover, for example, by adjusting the potential Vg1 of the first gate 121g and reducing the gain of the second cascode amplifier 120B, it is possible to prevent the signal amplitude from increasing and exceeding a high voltage in the second cascode amplifier 120B.

With the variable gain amplifier 100, it is possible to suppress degradation of matching on the input side of the cascode amplifier 120 and perform gain control while meeting the specifications of the high voltage of the cascode amplifier 120.

Next, a configuration example of the bias circuit will be described.

Figure 4B:
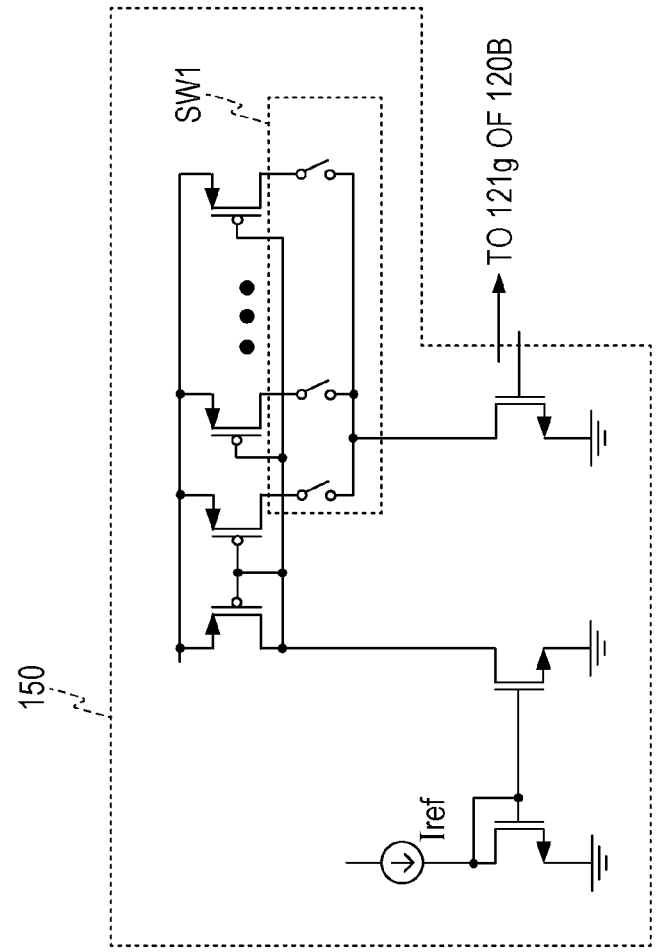
FIG. 4B is diagram depicting a configuration example of a variable bias circuit according to the first embodiment.
Figure 4A:
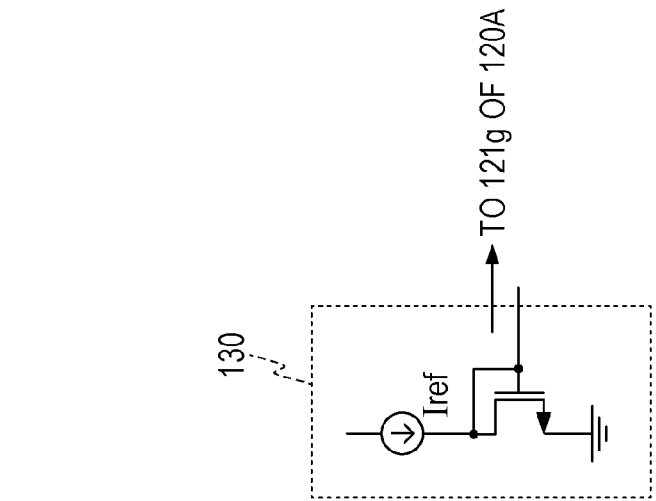
FIG. 4A is diagram depicting a configuration example of a fixed bias circuit according to the first embodiment.

FIG. 4A is a diagram depicting a configuration example of the fixed bias circuit 130. In FIG. 4A, connection of the fixed bias circuit 130 with the first cascode amplifier 120A forms a current mirror. As a result, a current which is M times larger than a reference current Iref flows through the transistor of the first cascode amplifier 120A. M is an arbitrary integer.

FIG. 4B is a diagram depicting a configuration example of the variable bias circuit 150. In FIG. 4B, connection of the variable bias circuit 150 with the second cascode amplifier 120B forms a current mirror. The amount of current flowing through the transistor of the second cascode amplifier 120B is controlled by ON/OFF of switches SW1 of the variable bias circuit 150. Incidentally, control of the switches SW1 is performed by, for example, an unillustrated controlling section in the variable gain receiver 10.

If the received power is high, the variable gain amplifier 100 operates in the low-gain mode; if the received power is low, the variable gain amplifier 100 operates in the high-gain mode. In consideration of an SNR and a high voltage, the variable gain amplifier 100 switches a gain by switching ON/OFF of the switches SW1 of FIG. 4B at a gain switching point (certain received power).

If all the switches SW1 are turned ON, the variable gain amplifier 100 is in the high-gain mode and a relatively high voltage is applied to the first gate 121g of the second cascode amplifier 120B. Moreover, if one of the switches SW1 is turned ON, the variable gain amplifier 100 is in the low-gain mode and a relatively low voltage is applied to the first gate 121g of the second cascode amplifier 120B.

As a method for determining the gain switching point, there are various methods. For example, in the high-gain mode, a voltage amplitude on the transistor or received power exceeding the high voltage of the transistor is selected as the gain switching point.

Figure 5A:
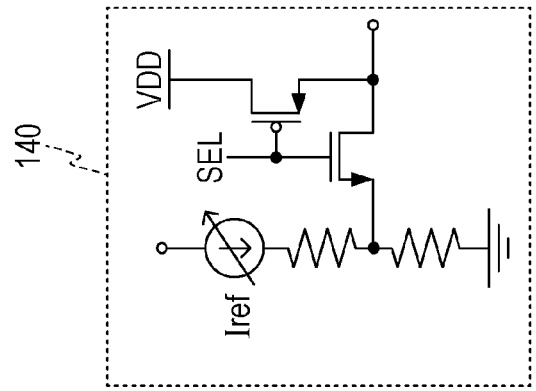
FIG. 5A is diagram depicting a configuration example of the variable bias circuit according to the first embodiment.
Figure 5B:
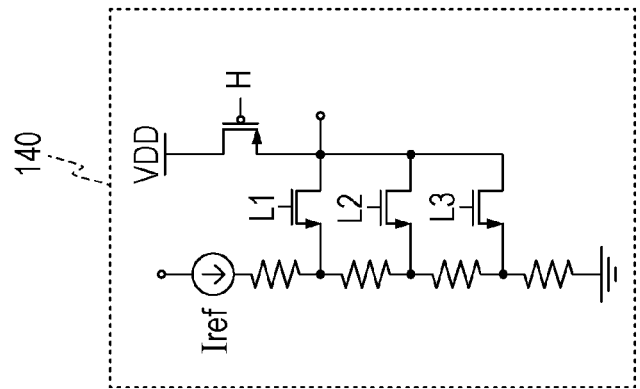
FIG. 5B is diagram depicting a configuration example of the variable bias circuit according to the first embodiment.

FIGS. 5A and 5B are diagrams, each depicting a configuration example of the variable bias circuit 140. In FIG. 5A, in the variable gain amplifier 100, selection as to whether a reference potential of a resistance through which the reference current Iref flows is applied to the second gate 122g of the first cascode amplifier 120A or VDD is applied thereto is made depending on whether a control signal SEL is high or low. This selection is performed by, for example, a controlling section (not depicted in the drawing).

In FIG. 5A, the variable gain amplifier 100 selects a potential to be applied to a switch and switches the gain at a gain switching point (certain received power). For example, if the control signal SEL is low, the variable gain amplifier 100 is in the high-gain mode and a relatively high voltage is applied to the second gate 122g of the first cascode amplifier 120A. Moreover, for example, if the control signal SEL is high, the variable gain amplifier 100 is in the low-gain mode and a relatively low voltage is applied to the second gate 122g of the first cascode amplifier 120A.

In FIG. 5B, the variable gain amplifier 100 selects a resistance of the resistances connected to a current source that outputs the reference current Iref, the resistance which is connected to the first cascode amplifier 120A, by using switches L1, L2, and L3 and selects a voltage to be applied to the second gate 122g.

In FIG. 5B, the variable gain amplifier 100 selects any one of the switches L1, L2, and L3 at a gain switching point (certain received power) and switches the gain. For example, if the switch L1 is selected, in the high-gain mode, a relatively high voltage is applied to the second gate 122g of the first cascode amplifier 120A. Moreover, for example, if the switch L2 is selected, in the medium-gain mode, a medium voltage is applied to the second gate 122g of the first cascode amplifier 120A. Furthermore, for example, if the switch L3 is selected, in the low-gain mode, a relatively low voltage is applied to the second gate 122g of the first cascode amplifier 120A.

By adjusting the potential of the second gate 122g of the first cascode amplifier 120A located in the previous stage, the variable gain amplifier 100 can suppress degradation of matching on the input side of the variable gain amplifier 100. Since the variable gain amplifier 100 can suppress a received power deviation in the signal band by suppressing the degradation of matching, it is possible to suppress a reduction in communication quality of a millimeter-wave circuit to which the variable gain amplifier 100 is applied, for example.

Moreover, by adjusting the potential of the first gate 121g of the second cascode amplifier 120B located in the subsequent stage, the variable gain amplifier 100 can make the cascode amplifier 120 achieve a power saving and improve the high voltage tolerance of the cascode amplifier 120.

Therefore, in the variable gain amplifier 100 having a multistage configuration, the variable gain amplifier 100 handling a high-frequency signal, it is possible to suppress degradation of the performance (for example, frequency characteristics, noise figure, linearity, and high voltage tolerance) of the variable gain amplifier 100 and change the gain of the variable gain amplifier 100.

Moreover, since the variable gain amplifier 100 uses a single-end signal, not a differential signal, as an input signal, as compared to the differential signal, it is possible to reduce power consumption and a mounting area (for example, reduce power consumption and a mounting area by one-half). That is, the variable gain amplifier 100 can reduce a circuit size and achieve a power saving. Therefore, for example, it is also possible to minimize the area of the variable gain amplifier 100, suppress the influence on the performance of the variable gain amplifier 100 near a sensitivity point, and perform transition to the low-gain mode.

Moreover, the variable gain amplifier 100 can use the same variable gain amplifier in a case where the variable gain amplifier 100 operates in the low-gain mode to perform nearby communication with a device with which communication is performed and a case where the variable gain amplifier 100 operates in the high-gain mode to perform communication with the device with which communication is performed, the device in a location far away therefrom. Therefore, it is possible to reduce the cost required for the variable gain amplifier 100.

Furthermore, the variable gain amplifier 100 can switch the gain between the high-gain mode and the low-gain mode in a short time and stay within limitations on a switching time described in the Wigig standard, for example. Incidentally, in order to make the gain switching time meet the WiGig standard, gain settings in the order of two stages, for example, are suitable.

Moreover, since the variable gain receiver 10 includes the variable gain amplifier 100, it is possible to obtain the same effects as those of the variable gain amplifier 100.

Second Embodiment

In the first embodiment, the configuration in which the cascode amplifiers 120 are connected in series in two stages has been described as an example; in a second embodiment, a configuration in which the cascode amplifiers 120 are connected in series in N stages will be described. Incidentally, N≥2 holds. The first embodiment is an embodiment obtained by setting N at 2 in this embodiment.

FIG. 6 is a diagram depicting a configuration example of a variable gain amplifier 100B according to the second embodiment. The variable gain amplifier 100B is part or the whole of the variable gain low noise amplifier 12 (see FIG. 1). The variable gain amplifier 100B is used in a microwave circuit or a millimeter-wave circuit.

The variable gain amplifier 100B has an input matching circuit 110, a cascode amplifier 120, a bias circuit 230, a variable bias circuit 140, an intermediate matching circuit 160, and an output matching circuit 170. In the variable gain amplifier 100B, the same configuration as the configuration of the variable gain amplifier 100 is identified with the same reference character and the description thereof will be omitted or simplified.

It is assumed that the first stage of a plurality of cascode amplifiers 120 is an A stage and the final stage is an N stage. The cascode amplifiers 120 include N cascode amplifiers 120: cascode amplifiers 120A, . . . , 120N. The bias circuits 230 include N bias circuits 230: bias circuits 230A, . . . , 230N and are connected to the cascode amplifiers 120. Each bias circuit 230 is similar to the fixed bias circuit 130 or the variable bias circuit 150. Moreover, the variable bias circuit 140 includes at least a variable bias circuit 140A, and the variable bias circuit 140A is connected to the cascode amplifier 120A. Furthermore, the intermediate matching circuits 160 are disposed between the adjacent cascode amplifiers 120 and include (N−1) intermediate matching circuits 160: intermediate matching circuits 160A, . . . , 160(N−1).

In FIG. 6, in the variable gain amplifier 100B, as the bias circuit 230 for applying a voltage to the first gate 121g of the cascode amplifier 120, a fixed bias circuit and a variable bias circuit are used. For example, the bias circuit 230A as the fixed bias circuit is connected to the cascode amplifier 120A in the first stage and the bias circuit 230N as the variable bias circuit is connected to the cascode amplifier 120N in the final stage.

In the cascode amplifier 120A disposed on the input side (the previous stage's side) of the variable gain amplifier 100B, the gain is switched by the adjustment of the potential Vg2 of the second gate 122g. In the cascode amplifier 120 disposed on the output side (the subsequent stage's side) of the variable gain amplifier 100B, the gain is switched by the adjustment of the potential Vg1 of the first gate 121g.

In the cascode amplifiers to the cascode amplifier in the (n1−1)-th stage, the potential Vg1 of the first gate 121g is adjusted, and, in the cascode amplifiers after the cascode amplifier in the n1-th stage, the potential Vg2 of the second gate 122g is adjusted.

Here, the gain of the cascode amplifier 120 in each stage is the same gain G1. If the gain is reduced by control of the potential Vg2, a voltage of the voltages applied to the cascode amplifiers 120, the voltage which is applied to an upper-side transistor (the cascode second transistor 122), is higher than a voltage which is applied to a lower-side transistor (the cascode first transistor 121).

In the variable gain amplifier 100B in which the input amplitude (the amplitude of the gate voltage) to the variable gain amplifier 100B is "A1", the number of stages of the variable gain amplifier 100B is "n1" (variable), and the maximum permissible voltage of the transistor is "Vm1", gain reduction control by the potential Vg2 is permitted to be performed on the cascode amplifiers to the cascode amplifier in the (n1−1)-th stage which satisfy equation (1), and the cascode amplifiers from the cascode amplifier in the n1-th stage require gain reduction control by the potential Vg1.

$$Vm1 > A1 \times (n1-1) \times G1 \quad (1)$$

Therefore, in the variable gain amplifier 100B, in the cascode amplifiers 120 in the first to (n1−1)-th stages, the potential Vg1 of the first gate 121g is adjusted, and, in the cascode amplifiers 120 in the n1-th to N-th stages, the potential Vg2 of the second gate 122g is adjusted, whereby it is possible to improve the high voltage tolerance.

Figure 7:
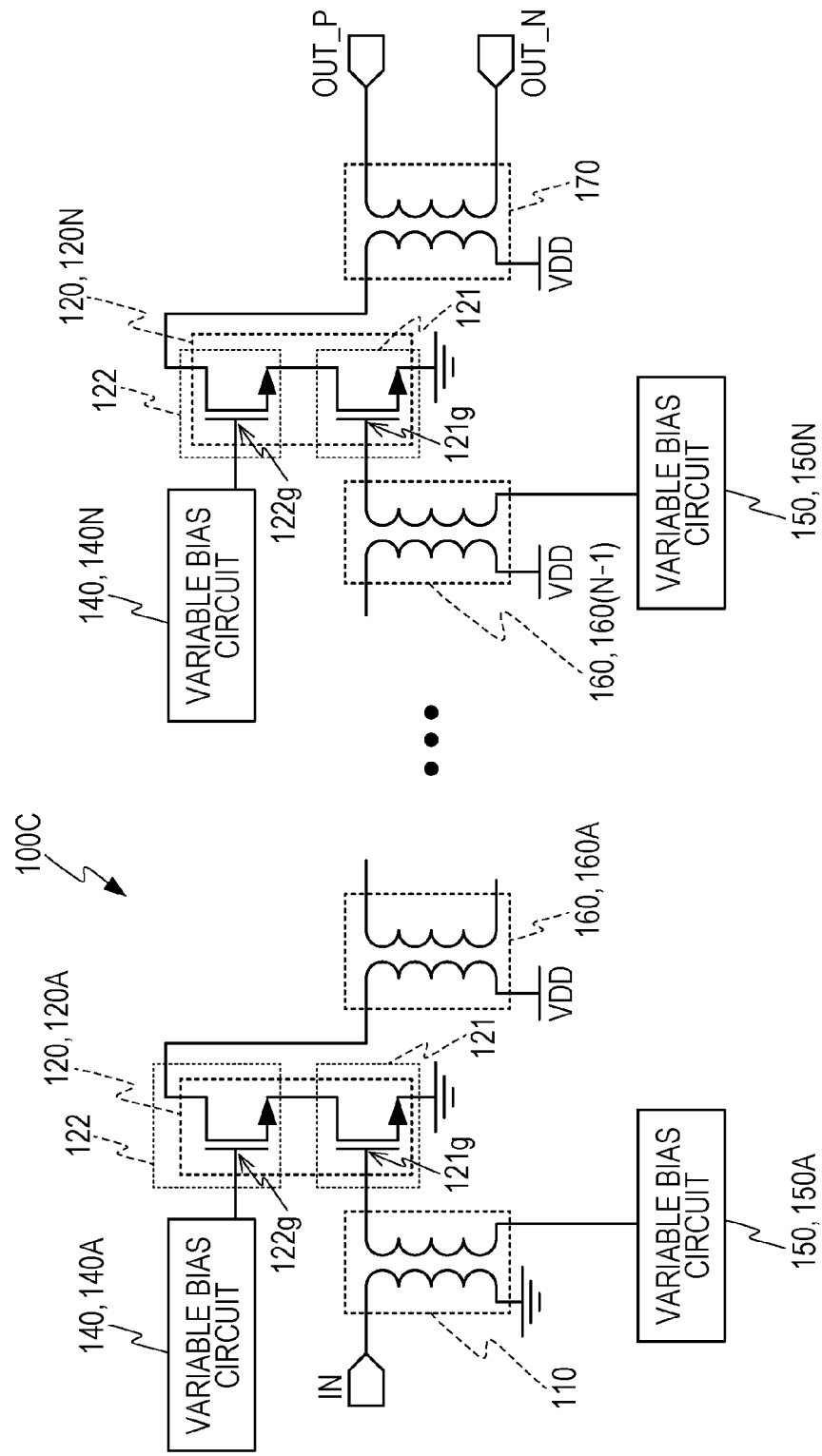
FIG. 7 is a diagram depicting a second configuration example of the variable gain amplifier according to the second embodiment.

FIG. 7 is a diagram depicting a configuration example of a variable gain amplifier 100C according to the second embodiment. The variable gain amplifier 100C is part or the whole of the variable gain low noise amplifier 12 (see FIG. 1). The variable gain amplifier 100C is used in a microwave circuit or a millimeter-wave circuit. The variable gain amplifier 100C is a modified example of the variable gain amplifier 100B. In the variable gain amplifier 100C, the same configuration as the configuration of the variable gain amplifiers 100 and 100B is identified with the same reference character and the description thereof will be omitted or simplified.

In the variable gain amplifier 100C, the variable bias circuits 140 (140A, . . . , 140N) are connected to the second gates 122g of the cascode amplifiers 120. Moreover, in the variable gain amplifier 100C, the variable bias circuits 150 (150A, . . . , 150N) are connected to the first gates 121g of the cascode amplifiers 120. In the variable gain amplifier 100C, the variable bias circuits 140 and 150 connected to the gates make it possible to increase the diversification of the gain adjustment of a circuit which is added to switch the gain of the cascode amplifier 120.

For example, the gain of the cascode amplifier 120A disposed on the input side of the variable gain amplifier 100C is switched by control of the potential Vg2 of the second gate 122g. Moreover, the gain of the cascode amplifier 120N disposed on the output side is switched by the adjustment of the potential Vg2 of the first gate 121g. Furthermore, the variable gain amplifier 100C controls, if necessary, both or one of the potential Vg1 of the first gate 121g and the potential Vg2 of the second gate 122g in each stage.

As compared to the variable gain amplifier 100C, since the variable gain amplifier 100B has a smaller number of variable bias circuits, the variable gain amplifier 100B can suppress the number of circuits which are added to switch the gain or simplify the circuit configuration.

Moreover, as compared to the variable gain amplifier 100B, since the variable gain amplifier 100C uses only the variable bias circuit as the bias circuit, the variable gain amplifier 100C can adjust the potential of each first gate 121g and the potential of each second gate 122g, which makes it possible to perform the adjustment of a gain more flexibly. Therefore, the variable gain amplifier 100C can output an intended voltage more flexibly than the variable gain amplifier 100B.

Furthermore, an amplifier that handles a high-frequency signal (for example, a millimeter-wave signal) may adopt a multistage configuration in which the degree of amplification per stage is low and the amplifiers are connected in multiple stages. In the amplifier having a multistate configuration, as a result of amplification being sequentially performed in the amplifiers, the signal amplitude is increased in the amplifier in the subsequent stage, but the variable gain amplifiers 100B and 100C using the amplifier having a multistage configuration can improve the high voltage tolerance.

Third Embodiment

In the first embodiment and the second embodiment, control of the gain of the cascode amplifier 120 by a bias circuit has been described as an example. In a third embodiment, control of the gain of the cascode amplifier 120 by control of reactance will be described.

Figure 8:
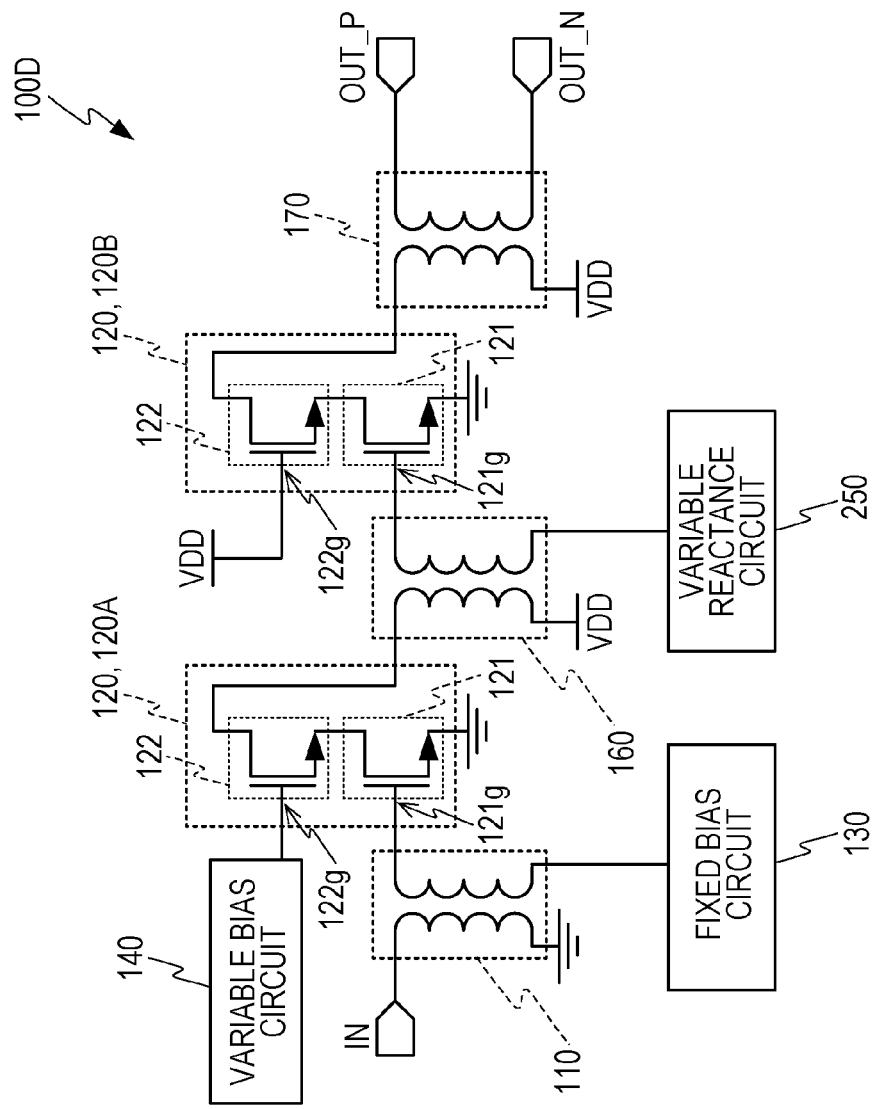
FIG. 8 is a diagram depicting a configuration example of a variable gain amplifier according to a third embodiment.

FIG. 8 is a diagram depicting a configuration example of a variable gain amplifier 100D according to the third embodiment. The variable gain amplifier 100D is part or the whole of the variable gain low noise amplifier 12 (see FIG. 1). The variable gain amplifier 100D is used in a microwave circuit or a millimeter-wave circuit. In the variable gain amplifier 100D, the same configuration as the configuration of the variable gain amplifiers 100, 100B, and 100C is identified with the same reference character and the description thereof will be omitted or simplified. As compared to the variable gain amplifier 100, the variable gain amplifier 100D includes a variable reactance circuit 250 in place of the variable bias circuit 150.

The variable gain amplifier 100D controls the gain of the second cascode amplifier 120B by the variable reactance circuit 250 connected to the intermediate matching circuit 160 as a transformer. The variable reactance circuit 250 controls the reactance on the input side (for example, the intermediate matching circuit 160) of the cascode first transistor 121 of the second cascode amplifier 120B. That is, the variable reactance circuit 250 is an example of a reactance controlling section.

Figure 9:
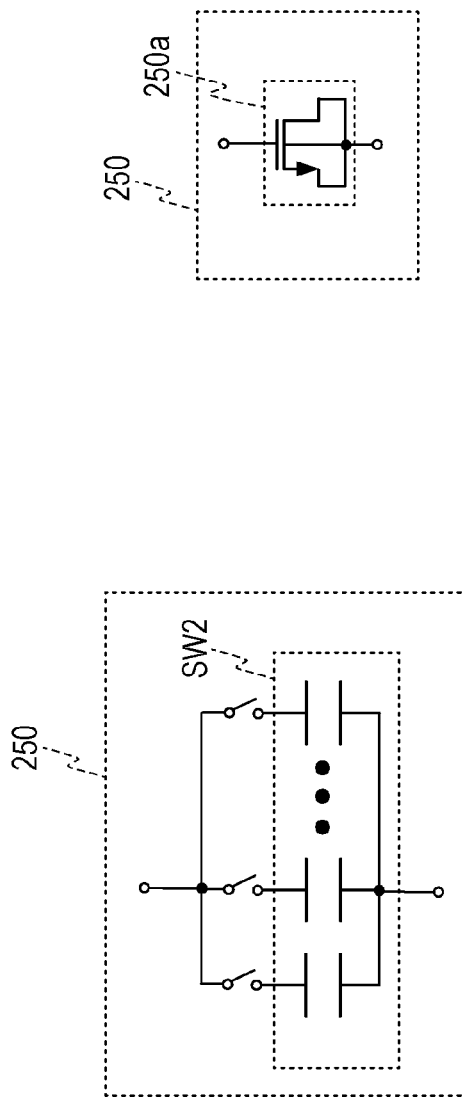
FIG. 9A is diagrams depicting a configuration example of a variable reactance circuit according to the third embodiment.
FIG. 9B is diagram depicting a configuration example of a variable reactance circuit according to the third embodiment.

FIGS. 9A and 9B are diagrams, each depicting a configuration example of the variable reactance circuit 250. The variable reactance circuit 250 depicted in FIG. 9A switches the value of a capacity connected to the second cascode amplifier 120B by ON/OFF control of switches SW2.

The variable reactance circuit 250 depicted in FIG. 9B includes a metal oxide semiconductor (MOS) varactor 250a. The MOS varactor 250a controls the value of a capacity connected to the second cascode amplifier 120B by control of a bias potential which is applied to the MOS varactor 250a.

Incidentally, the control of the switches SW2 in FIG. 9A and the control of the bias potential in FIG. 9B are performed by a controlling section (not depicted in the drawing), for example. In both FIGS. 9A and 9B, the variable gain amplifier 100D is switched between the high-gain mode and the low-gain mode, for example, as a result of the value of the capacity being switched.

Since the variable gain amplifier 100D controls the reactance, the variable gain amplifier 100D can suppress a decrease in a drain-source voltage Vds of the cascode first transistor 121 of the second cascode amplifier 120B and perform gain control. As compared to the variable bias circuit 140, since the variable reactance circuit 250 can suppress an increase in the drain-source voltage of the cascode second transistor 122, the variable reactance circuit 250 has an advantage in high voltage tolerance.

Incidentally, in this embodiment, a configuration in which the reactance circuit is connected to the second cascode amplifier 120B has been mainly described as an example, but, in the variable gain amplifier 100D, the variable reactance circuit may be connected to another cascode amplifier 120.

Moreover, in this embodiment, as is the case with the first embodiment, as the variable gain amplifier 100D, the variable gain amplifier including cascode amplifiers 120 in two stages has been described as an example, but, as is the case with the second embodiment, the variable gain amplifier 100D may be the variable gain amplifier including cascode amplifiers 120 in N stages.

Fourth Embodiment

For example, variations in process, supply voltage, or temperature (PVT) (PVT variations) change circuit characteristics. The influence of the PVT variations on the circuit characteristics is pronounced in a high-frequency circuit (for example, a millimeter-wave circuit).

For example, a state in which a transmitter gradually gets closer to a receiver from a distant location and the received power is increased from low received power will be described. Since the received power is low, the variable gain amplifier operates in the high-gain mode, and, after the received power is increased and becomes received power exceeding the high voltage of the transistor, the variable gain amplifier transitions to the low-gain mode.

The design of a gain switching point (received power) when the gain variations caused by the PVT variations are ±10 dB will be described.

The maximum gain condition of the PVT variations in the high-gain mode is that every voltage which is applied to the transistor is a voltage that does not exceed the high voltage. It is necessary to set received power which is lower, by 10 dB, than a gain switching point observed when no PVT variations occur as a gain switching point. As a result, the SNR at the gain switching point is decreased by 10 dB.

Furthermore, if switching from the high-gain mode to the low-gain mode is performed, a suitable SNR for communication in the low-gain mode has to be ensured. The worst case in the low-gain mode is a case where a minimum gain condition is raised by the PVT variations. Since the gain is reduced by 10 dB and the NF is increased, an SNR of 10 dB or more is further decreased.

In total, when there are PVT variations, as compared to a case where no PVT variations are observed, the SNR in the low-gain mode is degraded by 20 dB or more. It is difficult to ensure a necessary SNR at a gain switching point because the high voltage tolerance is degraded or the communication is disconnected at the gain switching point.

Therefore, in consideration of a high voltage and an SNR, the influence of the PVT variations is suppressed.

It is possible to reduce the influence of the fluctuations or variations in the power-supply voltage by using a low drop out (LDO). The LDO is a linear regulator that operates even by a low input-output potential difference.

The influence of the fluctuations or variations in the temperature can be reduced by adjusting the reference current Iref of the bias circuit depicted in FIGS. 4A and 4B. For example, by providing the value of the reference current Iref depicted in FIGS. 4A and 4B with a temperature gradient, it is possible to suppress the gain variations of the variable gain amplifier caused by the temperature. For example, by assigning weights to a reference current 1/R which is independent of the temperature and a reference current Vt/R which is dependent on the temperature by using the structure of the current mirror and adding them by a circuit similar to the circuit of FIG. 4B, it is possible to set the temperature gradient of the reference current Iref arbitrarily. (As for the specific structures of the reference current Vt/R and the reference current 1/R, see Behzad Razavi (Translation supervised by Tadahiro Kuroda), "Analog CMOS Syuseki Kairo no Sekkei Ouyouhen", MARUZEN Co., Ltd., p. 477, July, 2000.)

It is relatively easy to compensate for the fluctuations or variations in the power-supply voltage and the temperature.

Figure 10:
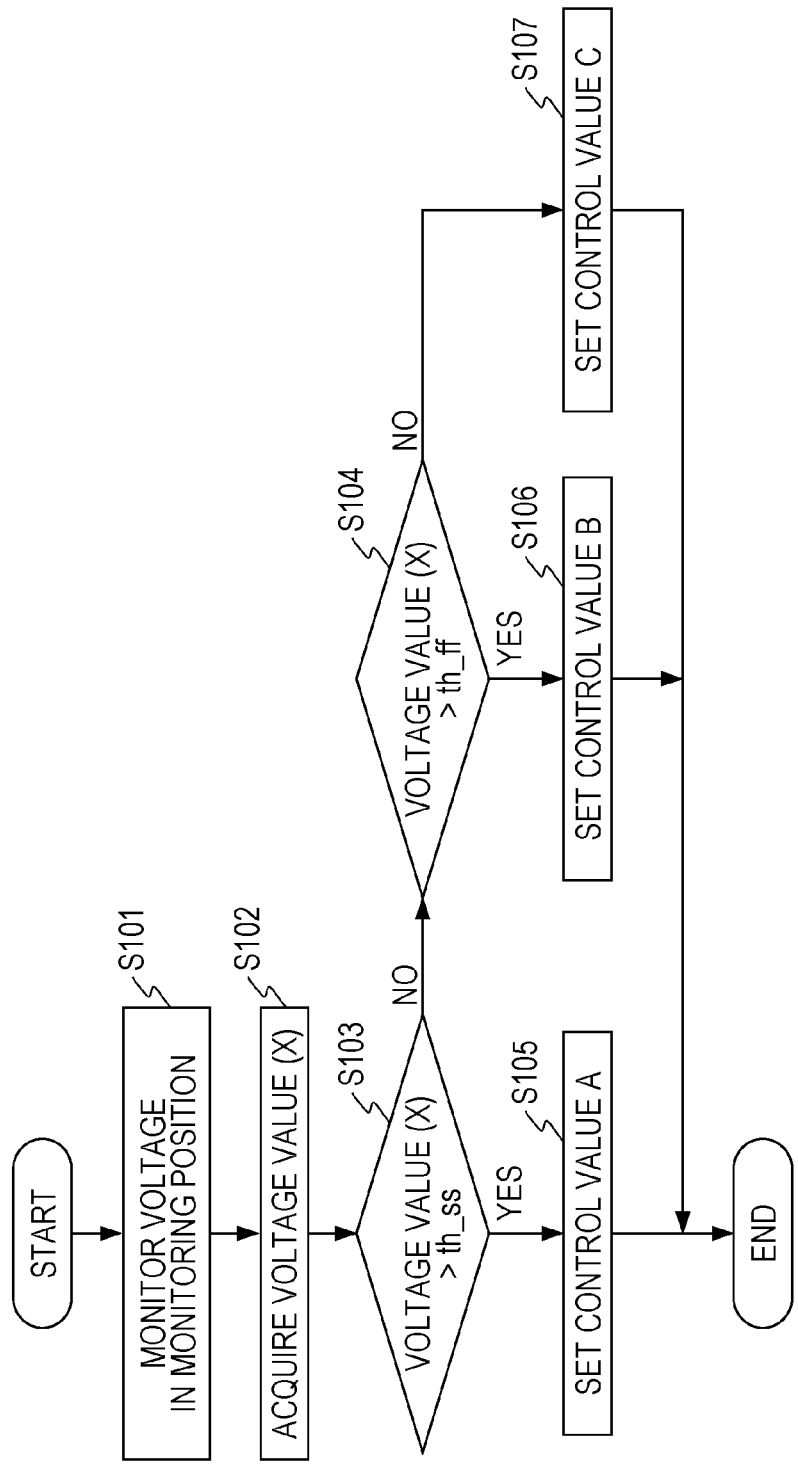
FIG. 10 is a flowchart depicting an example of a compensation flow of process variations according to a fourth embodiment.

Here, a method for suppressing the process variations (production variations) will be described. FIG. 10 is a flowchart depicting an example of a compensation flow of the process variations. By processing of FIG. 10, a control parameter for controlling the variable gain amplifier is set. Incidentally, the process variations occur in each transistor. An integrated circuit (IC) is formed of a large number of transistors. In FIG. 10, a compensation flow is performed for each IC.

Incidentally, in the IC, a variable gain amplifier 100E (see, for example, FIGS. 12A and 12B), for example, is included. The variable gain amplifier 100E includes, for example, any one of the variable gain amplifiers 100, 100B, 100C, and 100D. The variable gain amplifier 100E is used in a microwave circuit or a millimeter-wave circuit. Moreover, in the IC, a variable gain receiver 10E may be included.

First, a controlling section (not depicted in the drawing) starts a DC potential monitor circuit 310 of the variable gain amplifier 100E and monitors the potential in a monitoring position (S101). The monitoring position is, for example, a point A of FIG. 11A which will be described later.

Then, the controlling section (not depicted in the drawing) makes a variable X hold a monitor value obtained by the DC potential monitor circuit 310 (S102). The monitor value is the value of the gate potential (the potential at the point A of FIG. 11A) of a diode-connected transistor in FIG. 11A which will be described later.

Then, the controlling section (not depicted in the drawing) compares the variable X with predetermined threshold values (th_ss, ts_ff) and classifies an IC for which compensation is to be made into Slow-Slow (SS), Typical (TT), Fast-Fast (FF) (S103, S104). Moreover, the controlling section (not depicted in the drawing) sets a control value in accordance with the value of SS, TT, or FF as the IC classification result (S105, S106, S107). The control value is a value indicating the state of the process variations, for example.

SS indicates that a threshold voltage of the transistor included in the IC is higher than a predetermined range and the IC operates at a relatively low speed. FF indicates that the threshold voltage of the transistor included in the IC is lower than the predetermined range and the IC operates at a relatively high speed. TT indicates that the threshold voltage of the transistor included in the IC is within the predetermined range and the IC operates at a speed which is higher than the speed of SS and is lower than the speed of FF.

Incidentally, in FIG. 10, the process variations are classified into three stages; however, the process variations may be classified more minutely by using a lookup table, for example.

The process variations are variations of the threshold voltage Vth of a produced IC and do not change momentarily. The compensation flow depicted in FIG. 10 is performed, for example, at the time of the inspection of an IC in a factory or when an IC is turned on.

If the compensation flow is performed at the time of the inspection of an IC in a factory, the settings of a control value depicted in FIG. 10 (S105, S106, S107) are written into an electric fuse prepared in the IC, for example. By using the electric fuse, it is possible to implement an IC at low cost and reduce the cost of the variable gain amplifier into which the IC is implemented.

If the compensation flow is performed when an IC is turned on, a compensation program for making a computer perform the compensation flow of FIG. 10 may be recorded in a digital control circuit of the IC, for example. This makes it possible to perform the compensation flow at any time after shipment of the IC and detect process variations of the IC.

Figure 11B:
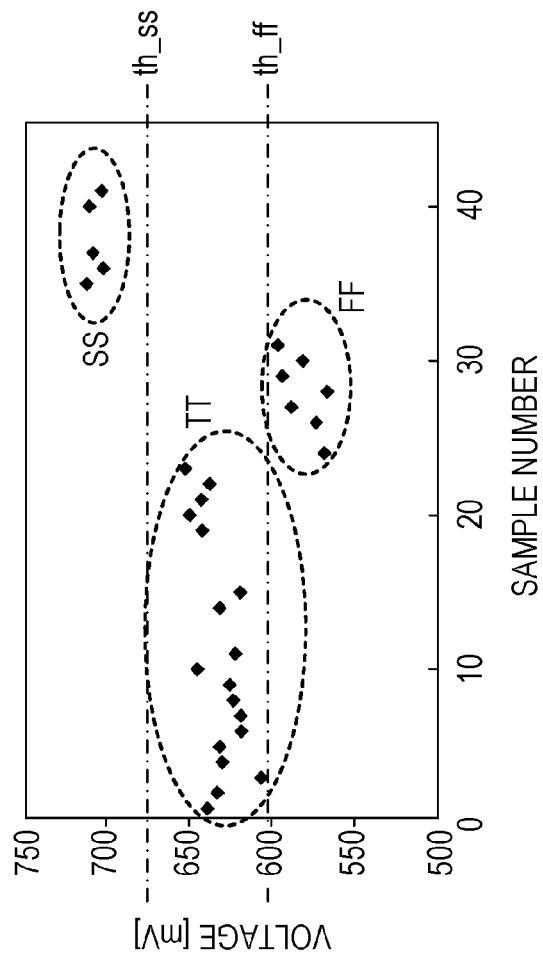
FIG. 11B is a diagram depicting an example of the results of measurement of the potential in a monitoring position by the DC potential monitor circuit according to the fourth embodiment.
Figure 11A:
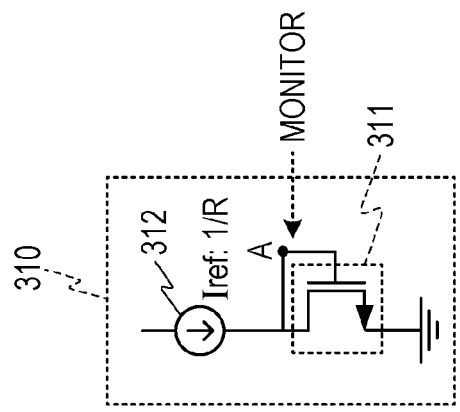
FIG. 11A is a diagram depicting an example of a DC potential monitor circuit according to the fourth embodiment.

FIG. 11A is a diagram depicting an example of the DC potential monitor circuit 310. The DC potential monitor circuit 310 has a diode-connected negative channel MOS (NMOS) transistor 311 to which a current source 312 that outputs a reference current (for example, the reference current 1/R) which is not dependent on the power-supply voltage and the temperature is connected. The variable gain amplifier 100E monitors the gate potential (the potential at the point A) of the NMOS transistor 311 by the DC potential monitor circuit 310 (see S101 of FIG. 10).

By detecting the potential at the point A, the variable gain amplifier 100E can determine the process variations of the NMOS transistor 311 and determine the process variations of the IC in which the DC potential monitor circuit 310 is implemented. Therefore, the DC potential monitor circuit 310 is an example of a process variation detecting section that detects process variations of an amplifier.

FIG. 11B is a diagram depicting an example of the results of measurement of the potential in the monitoring position (point A), the measurement performed by the DC potential monitor circuit 310 of FIG. 11A. With reference to FIG. 11B, it is revealed that the voltage values at the point A are separated, in accordance with a measurement sample, into a region which is estimated to be TT, a region which is estimated to be FF, and a region which is estimated to be SS.

Therefore, as a result of the threshold value th_ff being set between the region which is estimated to be TT and the region which is estimated to be FF, the potential monitor circuit 310 can easily discriminate between TT and FF. Moreover, as a result of the threshold value th_ss being set between the region which is estimated to be TT and the region which is estimated to be SS, the potential monitor circuit 310 can easily discriminate between TT and SS. By using the DC potential monitor circuit 310, the variable gain amplifier 100E can easily determine whether the process variations of the IC are SS, TT, or FF.

Incidentally, the use of the current mirror used for current adjustment as the process monitor circuit eliminates the need to implement an additional process monitor circuit.

Figure 12B:
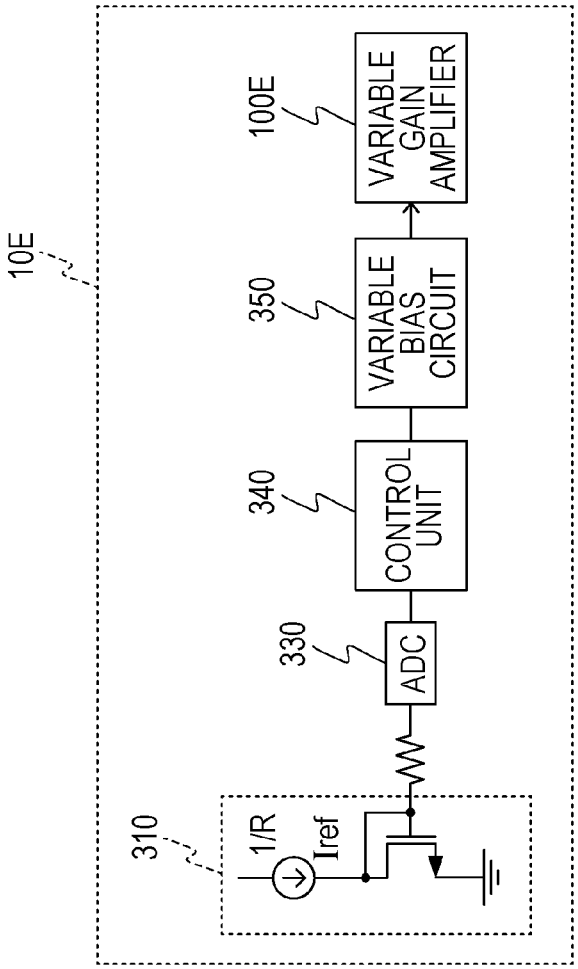
FIG. 12B is diagram depicting an example of a variable gain receiver according to the fourth embodiment.
Figure 12A:
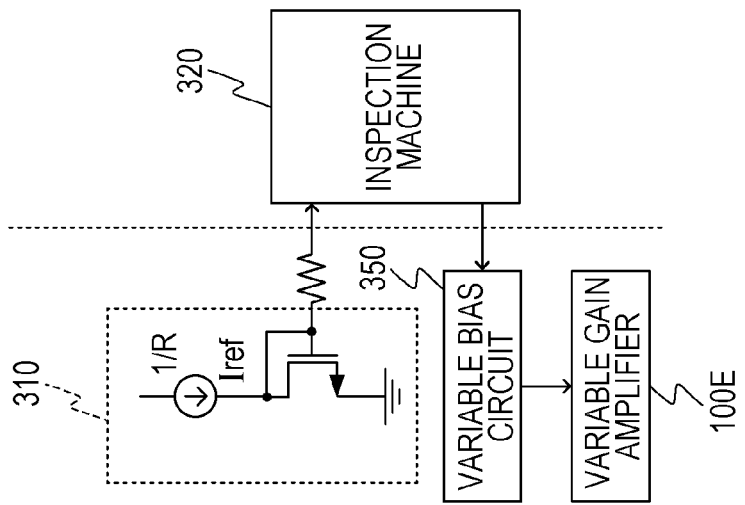
FIG. 12A is diagram depicting an example of a circuit that performs the compensation flow of process variations according to the fourth embodiment.

FIGS. 12A and 12B are diagrams, each depicting an example of a circuit that performs the compensation flow of FIG. 10. FIG. 12A is a diagram including an inspection machine 320 used when the inspection of an IC is made in a factory and the variable gain amplifier 100E. In FIG. 12A, the compensation flow depicted in FIG. 10 is performed by the inspection machine 320 outside the IC. A circuit depicted in FIG. 12A includes the DC potential monitor circuit 310, the inspection machine 320, a variable bias circuit 350, and the variable gain amplifier 100E. The DC potential monitor circuit 310, the variable bias circuit 350, and the variable gain amplifier 100E are implemented into the same IC, for example, and the inspection machine 320 is prepared separately as an external device. The depicted configuration of the inside of the IC of FIG. 12A may be part of the variable gain receiver 10E, for example.

The inspection machine 320 has read only memory (ROM) and a central processing unit (CPU), for example. The inspection machine 320 executes the compensation program stored in the ROM by the CPU, for example, and sends a control signal to the variable bias circuit 350. The control signal includes information on control values A, B, and C in accordance with the process variations of the IC, for example.

The variable bias circuit 350 includes, for example, a circuit similar to the variable bias circuits 140 and 150 described in the first to third embodiments and acquires the control signal from the inspection machine 320. Therefore, the variable gain receiver 10E can generate a bias voltage in consideration of the process variations of the IC and control and supply the bias voltage to the cascode amplifier 120 of the variable gain amplifier 100E, for example.

With the configuration example of FIG. 12A, the variable gain receiver 10E makes an inspection of process variations by using the inspection machine 320 outside the IC and outputs the inspection result to the variable bias circuit 350. Therefore, since the bias voltage generated in consideration of the process variations is supplied to the variable gain amplifier 100E, the variable gain amplifier 100E can make an inspection as to whether or not a desired operation is performed. Moreover, the inspection of process variations can be finished in a factory prior to shipment of an IC.

FIG. 12B is a diagram including the variable gain amplifier 100E when an inspection of process variations is made at power-on. The variable gain receiver 10E in an IC includes the DC potential monitor circuit 310, an analog to digital converter (ADC) 330, a control unit 340, the variable bias circuit 350, and the variable gain amplifier 100E. The depicted configuration of the inside of the IC of FIG. 12B may be part of the variable gain receiver 10E, for example.

The ADC 330 converts the DC potential at the point A, the DC potential obtained by the DC potential monitor circuit 310, from an analog value to a digital value.

The control unit 340 has read only memory (ROM) and a central processing unit (CPU), for example. The control unit 340 executes the compensation program stored in the ROM by the CPU, for example, and sends a control signal to the variable bias circuit 150. The control signal includes information on control values A, B, and C in accordance with the process variations of the IC, for example.

The variable bias circuit 350 includes, for example, a circuit similar to the variable bias circuits 140 and 150 described in the first to third embodiments and acquires the control signal from the control unit 340. Therefore, the variable gain receiver 10E can generate a bias voltage in consideration of the process variations of the IC and supply the bias voltage to the cascode amplifier 120 of the variable gain amplifier 100E, for example.

Incidentally, the DC potential monitor circuit 310 may use the reference current 1/R and the reference current Vt/R in place of the reference current 1/R as the reference current Iref. Since it is possible to grasp the dependence on the temperature by monitoring (for example, comparing) the values of the reference current 1/R and the reference current Vt/R, it is possible to perform temperature compensation.

In accordance with the configuration example of FIG. 12B, the control unit 340 makes an inspection of process variations in the IC. Therefore, the variable gain receiver 10E can supply the bias voltage generated in consideration of process variations to the variable gain amplifier 100E.

Incidentally, as a comparative example of this embodiment, there is a semiconductor integrated circuit having a delay circuit (see Japanese Unexamined Patent Application Publication No. 2005-117442). The delay circuit has a constant current source, a delay stage in which the operation delay time of an output with respect to an input is determined depending on a constant current by the constant current source, and a compensation circuit that compensates for the temperature fluctuations of the delay stage, the power-supply voltage fluctuations, and the fluctuations in delay characteristics caused by process variations in an opposite direction.

Since the semiconductor integrated circuit of the comparative example compensates for the PVT variations in an analog fashion, it is difficult to do the circuit design. Moreover, with the semiconductor integrated circuit of the comparative example, it is difficult to compensate for all the influences of PVT by a simple current gradient, which makes it difficult to acquire a necessary amount of compensation.

On the other hand, in this embodiment, by giving consideration to the PVT variations, the variable gain receiver 10E can compensate for the PVT variations in a digital fashion and suppress an increase in the consumption current and the area of the circuit without the need for the construction of a complicated compensation mechanism provided by an analog circuit. Moreover, the variable gain receiver 10E can facilitate the circuit design and also shorten the development period. Furthermore, the variable gain receiver 10E can suppress the magnitude of the fluctuations in gain with respect to PVT in a high-frequency circuit (for example, a millimeter-wave circuit) and prevent the amplitude of a voltage which is applied to the transistor in the variable gain amplifier 100E from becoming more than or equal to an estimated amplitude. For example, the variable gain receiver 10E can prevent a voltage which is applied to a transistor of an amplifier in a subsequent stage from becoming about 2 V with respect to a received input of about −6 dBm at the time of near-by reception of about 3 mm and improve the high voltage tolerance.

Incidentally, apart from PVT variations, in the variable gain receiver 10E, a table (not depicted in the drawing) may hold a gain difference of the variable gain amplifier 100E of each channel (frequency channel). As is the case with the information on the process variations, as a result of the information on the gain difference of each channel being provided to the variable bias circuit, the variable gain amplifier 100E can operate in consideration of the gain difference of each channel. That is, the information on the gain difference of each channel may be used for correction of a gain deviation between channels.

Incidentally, in this embodiment, in place of the variable bias circuit 350, a variable reactance circuit may be provided. The variable reactance circuit controls reactance in response to the process variations of an IC. As a result, it is possible to suppress the magnitude of the fluctuations in gain with respect to PVT in a high-frequency circuit (for example, a millimeter-wave circuit) and prevent the amplitude of a voltage which is applied to the transistor in the variable gain amplifier 100E from becoming more than or equal to an estimated amplitude.

Fifth Embodiment

In the first to fourth embodiments, a case where the cascode amplifier is provided as the amplifier of the variable gain amplifier has been described as an example. In a fifth embodiment, the variable gain amplifier may include an amplifier 100 other than the cascode amplifier.

FIG. 13A is a diagram depicting a configuration example of a variable gain amplifier 100F according to the fifth embodiment. The variable gain amplifier 100F is part or the whole of the variable gain low noise amplifier 12 (see FIG. 1). The variable gain amplifier 100F is used in a microwave circuit or a millimeter-wave circuit. In the variable gain amplifier 100F, the same configuration as the configuration of the variable gain amplifiers 100, 100B, 100C, and 100D is identified with the same reference character and the description thereof will be omitted or simplified.

The variable gain amplifier 100F includes a plurality of amplifiers 200 (200A, 200B, ..., 200N). In the variable gain amplifier 100F, between an input terminal (IN) and the amplifier 200A in the first stage, the input matching circuit 110 is provided. In the variable gain amplifier 100F, between an output terminal (OUT) and the amplifier 200 in the final stage (here, the amplifier 200D), the output matching circuit 170 is provided. Between two adjacent amplifiers 200, the intermediate matching circuits 160 in one or more stages are provided.

FIG. 13B is a diagram depicting a first configuration example of the amplifier 200. In the first configuration example, the amplifier 200 includes a source grounding-type amplifier (a source grounding amplifier circuit) 220.

FIG. 13C is a diagram depicting a second configuration example of the amplifier 200. In the second configuration example, the amplifier 200 includes the cascode amplifier 120. The cascode amplifier 120 includes, for example, the cascode amplifier 120A or the cascode amplifier 120B described above.

As the amplifier 200, the source grounding-type amplifier 220 may be selected or the cascode amplifier 120 may be selected. For example, as the amplifier 200 in a stage subsequent to a predetermined stage, the cascode amplifier 120 is selected.

The source grounding-type amplifier 220 includes one amplifier, and the cascode amplifier 120 includes a plurality of transistors. In settings in which the source grounding-type amplifier 220 and the cascode amplifier 120 obtain the same gain, a voltage which is applied to the transistor of the source grounding-type amplifier 220 is higher than a voltage which is applied to the cascode amplifier 120. Therefore, the high voltage tolerance of the cascode amplifier 120 is higher than the high voltage tolerance of the source grounding-type amplifier 220.

The source grounding-type amplifier is used as the amplifiers to the amplifier in the (n2−1)-th stage, and the cascode amplifier is used as the amplifiers after the amplifier in the n2-th stage.

Here, the gain of the amplifier 200 in each stage is the same gain G2, the input amplitude (the amplitude of a gate voltage) of the amplifier 200 is "A2", the number of stages of the amplifier 200 is "n2" (variable), the maximum permissible voltage of the transistor is "Vm2", and the variable gain amplifier 100F which satisfies equation (2) has a source grounding-type configuration to the (n2−1)-th stage and a cascode-type configuration from the n2-th stage.

$$Vm2 > A2 \times (n2-1) \times G2 \quad (2)$$

Thus, the variable gain amplifier 100F in which the amplifiers 200 in the first to (n2−1)-th stages are the source grounding-type amplifiers 220 and the amplifiers 200 in the n2-th to N-th stages are the cascode amplifiers 120 can improve the high voltage tolerance.

Sixth Embodiment

A sixth embodiment is a modified example of the fifth embodiment. In the sixth embodiment, the use of a branching circuit will be described.

Figure 14:
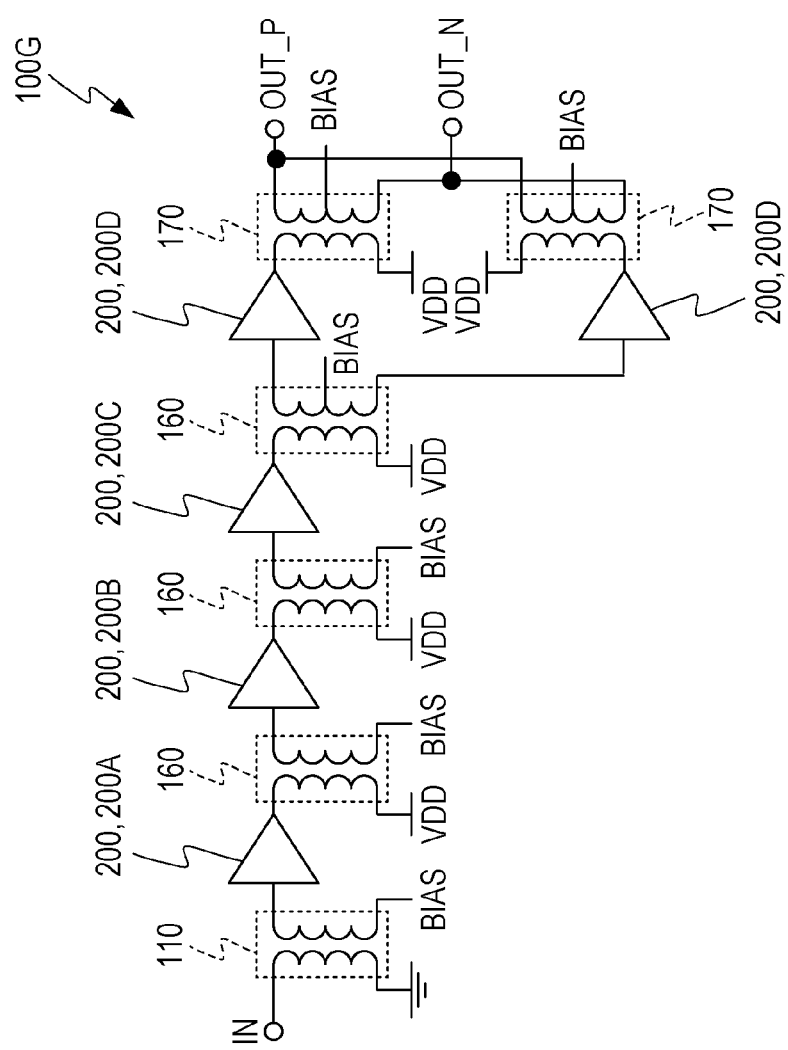
FIG. 14 is a diagram depicting a configuration example of a variable gain amplifier circuit according to a sixth embodiment.
Figure 15:
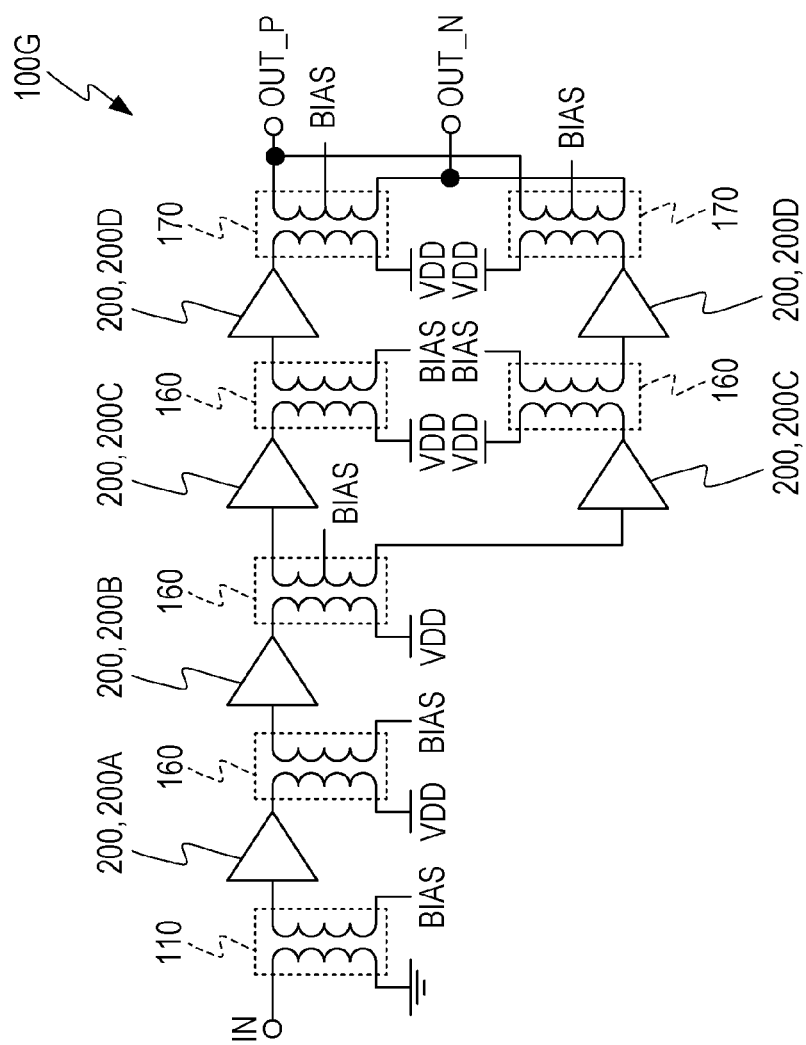
FIG. 15 is a diagram depicting a configuration example of the variable gain amplifier circuit according to the sixth embodiment.
Figure 16:
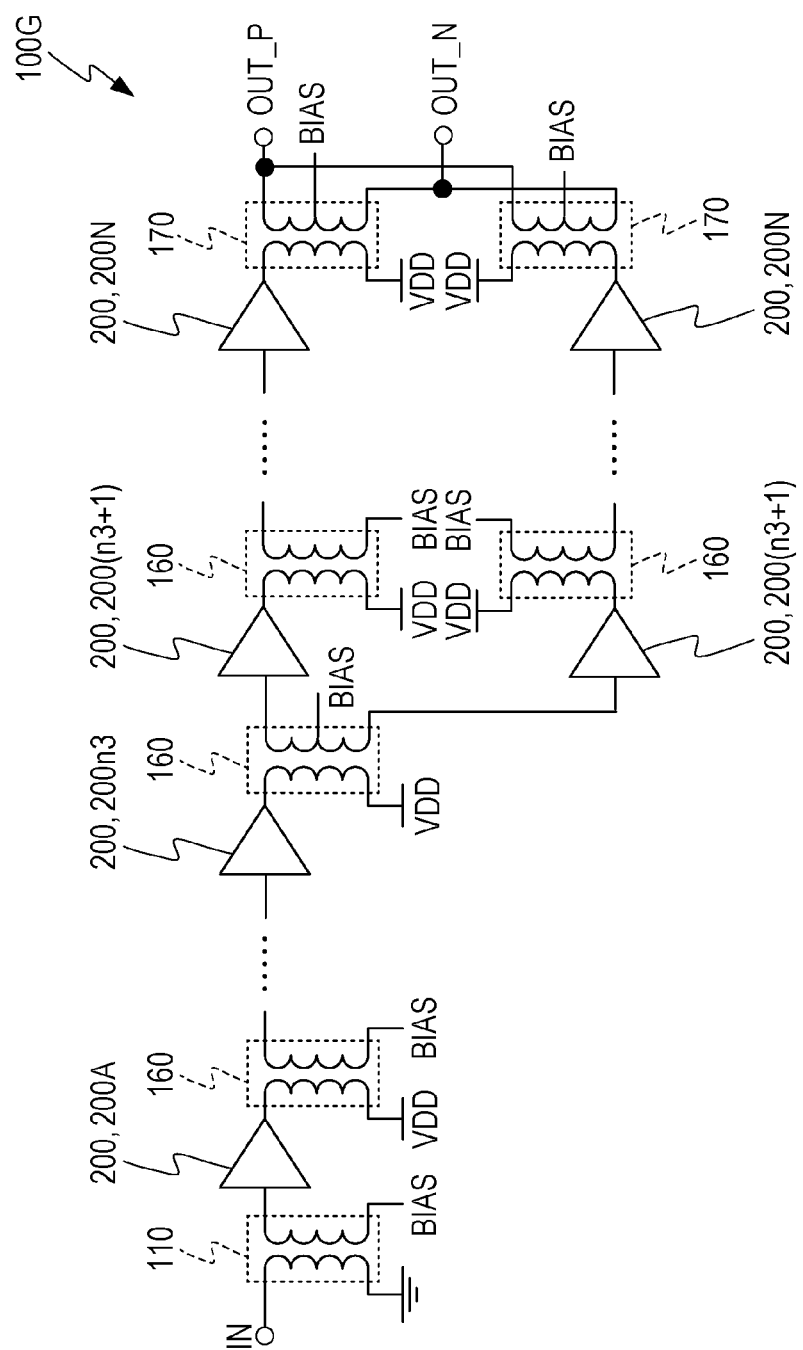
FIG. 16 is a diagram depicting a configuration example of the variable gain amplifier circuit according to the sixth embodiment.

FIGS. 14 to 16 are diagrams, each depicting a first configuration example of a variable gain amplifier 100G according to the sixth embodiment. The variable gain amplifier 100G is part or the whole of the variable gain low noise amplifier 12 (see FIG. 1). The variable gain amplifier 100G is used in, for example, a microwave circuit or a millimeter-wave circuit. In the variable gain amplifier 100G, the same configuration as the configuration of the variable gain amplifier 100F is identified with the same reference character and the description thereof will be omitted or simplified.

In FIG. 14, in the variable gain amplifier 100G, the amplifier 200 in the final stage is formed of a branching circuit and branches into two paths. That is, the stage other than the final stage is formed of one amplifier 200 and, in the final stage, two amplifiers 200 are connected in parallel. That is, the two paths obtained by branching include the amplifiers 200 in the same number of stages. As a result, the voltage which is applied to one output terminal (OUT) of the variable gain amplifier 100F is distributed to two output terminals (OUT_P, OUT_N) of the variable gain amplifier 100G, which makes it possible to decrease the voltage which is applied to one terminal.

Moreover, since a plurality of amplifiers 200 are connected in series and amplification by the amplifier 200 is repeated, the voltage which is applied to the subsequent stage is higher than the voltage which is applied to the previous stage. Therefore, although the voltage which is applied to the amplifier 200 in the final stage is high, it is possible to improve the high voltage tolerance by using the branching circuit in the final stage and suppress a breakdown of a circuit element of the amplifier 200 in the final stage.

In FIG. 15, each of amplifiers 200 in two stages, the final stage and a previous stage of the final stage, of the variable gain amplifier 100G is formed of a branching circuit and branches into two paths. That is, the stage other than the two successive stages from the final stage is formed of one amplifier 200, and, in the two successive stages from the final stage, two amplifiers 200 are connected in parallel. That is, the two paths obtained by branching include the amplifiers 200 in the same number of stages. As a result, the voltage which is applied to one output terminal (OUT) of the variable gain amplifier 100F is distributed to two output terminals (OUT_P, OUT_N) of the variable gain amplifier 100G, which makes it possible to decrease the voltage which is applied to one terminal.

Moreover, since a plurality of amplifiers 200 are connected in series, amplification by the amplifier 200 is repeated and the voltage which is applied to the subsequent stage is higher than the voltage which is applied to the previous stage. Therefore, although the voltage which is applied to the amplifier 200 in the final stage is high, by using the branching circuit in two successive stages from the final stage, it is possible to improve the high voltage tolerance and suppress a breakdown of a circuit element of the amplifiers 200 in two successive stages from the final stage.

Furthermore, in the variable gain amplifier 100G that processes a millimeter-wave signal, in a millimeter-wave circuit, the gain in the amplifier 200 in one stage is low and a signal loss (a branching loss) in a branching portion (a portion where the signal is made to branch in the branching circuit) is large. As a result of branching from the amplifiers in the final two stages, even when it is difficult to suppress the branching loss caused by the amplifier in the final stage, it is possible to suppress the branching loss by the amplifiers in the final two stages. Therefore, the variable gain amplifier 100G does not have to increase the gain prior to branching in consideration of the branching loss and can improve the high voltage tolerance as the whole of the variable gain amplifier 100G.

In FIG. 16, the amplifier 200 branches into two paths from the amplifier 200 in the final n-th stage by using a branching circuit. That is, the previous stage's side of the variable gain amplifier 100G is formed of one system (without branching) and the circuit size can be suppressed. The subsequent stage's side of the variable gain amplifier 100G is formed of two systems (with branching) to meet predetermined standards of the high voltage tolerance. This makes it possible to implement a multistage amplifier circuit with high voltage tolerance as the whole of the variable gain amplifier 100G.

The amplifiers to the amplifier in the n3-th stage are arranged in series in a signal branch road of one system, and the amplifiers from the amplifier in the (n3+1)-th stage branch into signal paths of a plurality of systems (for example, two systems) and are arranged in series in each path.

Here, the gain of the amplifier 200 in each stage is assumed to be the same gain G3. When the input amplitude of the amplifier 200 is "A3", the number of stages of the amplifier 200 is "N" (variable), and the maximum permissible voltage of the amplifier 200 is "Vm3", a configuration without branching is permitted to be adopted in the amplifiers 200 to the amplifier 200 in the n3-th stage which satisfy the relationship of equation (3) and a configuration with branching is required in the amplifiers 200 from the amplifier 200 in the (n3+1)-th stage.

$$Vm3 > A3 \times G3^{n3} + DC\ voltage \quad (3)$$

Thus, if the amplifiers 200 in the first to n3-th stages are disposed in series in a signal path of one system and the amplifiers 200 in the n3+1-th to N-th stages are disposed in series in each of the signal paths of a plurality of systems, it is possible to improve the high voltage tolerance of the variable gain amplifier 100G.

Incidentally, in this embodiment, by setting the number of times of branching at two or more (two or more systems), the high voltage tolerance can be further improved.

Incidentally, the present disclosure is not limited to the configurations of the embodiments described above. The present disclosure can be applied to any configuration as long as the configuration can achieve the function described in the claims or the functions of the configurations of the embodiments.

For example, in the present disclosure, the cases where, if the voltage exceeds the high voltage in the previous stage's side amplifier, the variable gain amplifier changes a gate to which the bias voltage is applied from the first gate to the second gate on the subsequent stage's side, forms a circuit by changing the amplifier from the source grounding amplifier to the cascode amplifier, and forms a circuit by changing a configuration without branching to a configuration with branching have been described as examples. Incidentally, these cases may be combined appropriately to improve the high voltage tolerance.

For example, the variable gain amplifier may adopt a configuration in which the source grounding amplifier is disposed on the previous stage's side, the cascode amplifier is disposed in an intermediate stage, and the cascode amplifier and the branching circuit are used on the subsequent stage's side. Moreover, the variable gain amplifier may adopt a configuration in which the source grounding amplifier is disposed on the previous stage's side, the branching circuit is disposed in an intermediate stage, and the branching circuit and the cascode amplifier are used on the subsequent stage's side. Furthermore, the variable gain amplifier may adopt a configuration in which the cascode amplifier is disposed on the previous stage's side and the branching circuit and the cascode amplifier are used on the subsequent stage's side. In addition, the variable gain amplifier may use the branching circuit on the previous stage's side and use the branching circuit and the cascode amplifier on the subsequent stage's side.

For example, in the present disclosure, the placement of the source and the drain of the transistor included in the amplifier may be reversed.

For example, in the present disclosure, the placement of a positive channel MOS (PMOS) and an NMOS may be reversed.

For example, in the present disclosure, a case where the cascode amplifier includes the source grounding amplifier circuit and the gate grounding amplifier circuit and the drain of the source grounding amplifier circuit and the source of the gate grounding amplifier circuit are connected has been described as an example. Incidentally, the cascode transistor is an example of a configuration in which transistors are stacked vertically, and another configuration in which transistors are stacked vertically may be adopted. For example, an inverter-type amplifier that uses a PMOS source grounding-type amplifier in an upper-side first transistor and an NMOS source grounding-type amplifier in a lower-side second transistor may be used.

For example, in the present disclosure, a case where the MOS-type transistor is used has been described as an example. Incidentally, in place of the MOS-type transistor, a transistor of the other type (for example, a bipolar-type transistor) may be used. For example, in the present disclosure, the variable gain amplifier can reduce the characteristic degradation by Hot carrier injection (HCI) by suppressing the voltage that applies to the transistor.

Incidentally, the embodiments may be combined appropriately.

While various embodiments have been described with reference to the drawings, it goes without saying that the present disclosure is not limited to these examples. It is obvious that a person skilled in the art can conceive of various examples of changes or modifications in the scope described in the claims, and it is a matter of course that these examples are also construed as belonging to the technical scope of the present disclosure. Moreover, the component elements in the embodiments described above may be combined arbitrarily without departing from the spirit of the disclosure.

In the embodiments described above, the present disclosure has been described by taking up, as an example, a configuration in which the present disclosure is formed by using hardware, but the present disclosure can also be implemented by using software in cooperation with hardware.

Moreover, the functional blocks used in the descriptions of the embodiments described above are each implemented as LSI which is typically an integrated circuit. They may be individually constructed in chip form or may be constructed in chip form in such a way as to include part or all thereof. The name "LSI" is used here, but, depending on the difference in the degree of integration, it is sometimes called an IC, system LSI, super LSI, or ultra LSI.

Furthermore, the method for implementing the functional block as an integrated circuit is not limited to LSI, and the functional block may be implemented as an integrated circuit by using a dedicated circuit or a general-purpose processor. A field programmable gate array (FPGA) that is programmable after LSI is produced and a reconfigurable processor that allows the connection or settings of circuit cells in LSI to be reconfigured after LSI is produced may be used.

In addition, if the technology for implementing the functional block as an integrated circuit, the technology replacing LSI, appears by the development of the semiconductor technology or the advent of another derivative technology, it goes without saying that the functional block may be integrated by using that technology. The application of the biotechnology may be possible.

(General Outline of an Aspect of the Present Disclosure)

A first variable gain multistage amplifier of the present disclosure is a variable gain multistage amplifier including: an input terminal to which the input signal is input; multistage amplifiers amplify the input signal, the multistage amplifiers being connected in series; and an output terminal that outputs the amplified signal, wherein the multistage amplifiers include one or more successive cascode amplifiers, one of which is in final stage.

A second variable gain multistage amplifier of the present disclosure is the first variable gain multistage amplifier, the multistage amplifiers include a plurality of signal paths in after a predetermined stage, and each of the plurality of signal paths include the cascode amplifiers in the same number of stages.

A third variable gain multistage amplifier of the present disclosure is the first variable gain multistage amplifier and further includes a bias voltage controller, wherein the cascode amplifier includes a first transistor to which the input signal or the amplified signal is input, and the bias voltage controller controls, in the one or more successive cascode amplifiers including the final stage, a bias voltage which is applied to a first control input terminal of the first transistor.

A fourth variable gain multistage amplifier of the present disclosure is the third variable gain multistage amplifier, each of the one or more successive cascode amplifier includes a second transistor connected to the first transistor, and the bias voltage controller controls, in the one or more successive cascode amplifiers including a first stage, a bias voltage which is applied to a second control input terminal of the second transistor.

A fifth variable gain multistage amplifier of the present disclosure is the third or fourth variable gain multistage amplifier and further includes a process variation detector that detects process variations of the variable gain multistage amplifier, wherein the bias voltage controller controls the bias voltage in accordance with the detected process variations of the variable gain multistage amplifier.

A sixth variable gain multistage amplifier of the present disclosure is the first variable gain multistage amplifier and further includes a reactance controller, wherein the cascode amplifier includes a first transistor to which the input signal or the amplified signal is input, and the reactance controller controls, in the one or more successive cascode amplifiers including the final stage, a reactance on an input side of the first transistor.

A seventh variable gain multistage amplifier of the present disclosure is the sixth variable gain multistage amplifier and further includes a process variation detector that detects process variations of the variable gain multistage amplifier, wherein the reactance controller controls the reactance in accordance with the process variations of the detected variable gain multistage amplifier.

A receiver of the present disclosure includes: a variable gain multistage amplifier; an antenna that receives an electromagnetic wave and outputs the input signal to the variable gain multistage amplifier; a frequency converter that performs frequency conversion to convert a high-frequency signal obtained by amplification by the variable gain multistage amplifier to a baseband; and a signal processor that processes a signal subjected to frequency conversion by the frequency converter; wherein the variable gain multistage amplifier including: an input terminal to which the input signal is input; multistage amplifiers amplify the input signal, the multistage amplifiers being connected in series; and an output terminal that outputs the amplified signal, wherein the multistage amplifiers include one or more successive cascode amplifiers, one of which is in final stage.

The present disclosure is useful in a variable gain multistage amplifier that can suppress degradation of the performance of an amplifier and in a receiver and so forth.

What is claimed is:

1. A variable gain multistage amplifier comprising:
   an input terminal to which an input signal is input;
   multistage amplifiers connected in series which amplify the input signal; and
   an output terminal that outputs an amplified signal, wherein
   the multistage amplifiers include successive cascode amplifiers, one of the successive cascode amplifiers being in a final stage,
   the multistage amplifiers, after a predetermined stage, branch into a plurality of signal paths, and
   each of the plurality of signal paths includes a cascode amplifier in a same number of stages.

2. The variable gain multistage amplifier according to claim 1, further comprising:
   a bias voltage controller, wherein
   each of the successive cascode amplifiers includes a first transistor to which the input signal or the amplified signal is input, and
   the bias voltage controller controls, in the successive cascode amplifiers including the final stage, a bias voltage which is applied to a first control input terminal of the first transistor.

3. The variable gain multistage amplifier according to claim 2, wherein
   each of the successive cascode amplifiers includes a second transistor connected to the first transistor,
   one of the successive cascode amplifiers is in a first stage, and
   the bias voltage controller controls, in the successive cascode amplifiers, a bias voltage which is applied to a second control input terminal of the second transistor.

4. The variable gain multistage amplifier according to claim 2, further comprising:
   a process variation detector that detects process variations of the variable gain multistage amplifier, wherein
   the bias voltage controller controls the bias voltage in accordance with the detected process variations of the variable gain multistage amplifier.

5. The variable gain multistage amplifier according to claim 1, wherein
   one of the successive cascode amplifiers is a cascode amplifier in a first stage, and a number of signal paths at the final stage is larger than a number of signal paths at the first stage.

6. The variable gain multistage amplifier according to claim 1, wherein
one of the successive cascode amplifiers is a cascode amplifier in a first stage, and
a number of cascode amplifiers at the final stage is larger than a number of cascode amplifiers at the first stage.

7. The variable gain multistage amplifier according to claim 1, wherein
a number of signal paths after the predetermined stage is larger than a number of signal paths before the predetermined stage.

8. The variable gain multistage amplifier according to claim 1, wherein
a number of cascode amplifiers after the predetermined stage is larger than a number of cascode amplifiers before the predetermined stage.

9. A variable gain multistage amplifier comprising:
an input terminal to which an input signal is input;
multistage amplifiers amplify the input signal, the multistage amplifiers being connected in series;
an output terminal that outputs an amplified signal; and
a reactance controller, wherein
the multistage amplifiers include one or more successive cascode amplifiers, one of which is in a final stage,
each of the one or more successive cascode amplifiers includes a first transistor to which the input signal or the amplified signal is input, and
the reactance controller controls, in the one or more successive cascode amplifiers including the final stage, a reactance on an input side of the first transistor.

10. The variable gain multistage amplifier according to claim 9, further comprising:
a process variation detector that detects process variations of the variable gain multistage amplifier, wherein
the reactance controller controls the reactance in accordance with the process variations of the detected variable gain multistage amplifier.

11. A receiver comprising:
a variable gain multistage amplifier;
an antenna that receives an electromagnetic wave and outputs an input signal to the variable gain multistage amplifier;
a frequency converter that performs a frequency conversion to convert a high-frequency signal obtained by amplification by the variable gain multistage amplifier to a baseband; and
a signal processor that processes a signal subjected to the frequency conversion by the frequency converter; wherein
the variable gain multistage amplifier includes:
an input terminal to which the input signal is input;
multistage amplifiers connected in series which amplify the input signal; and
an output terminal that outputs an amplified signal, wherein
the multistage amplifiers include successive cascode amplifiers, one of which is in a final stage,
the multistage amplifiers, after a predetermined stage, branch into a plurality of signal paths, and
each of the plurality of signal paths includes a cascode amplifier in a same number of stages.

* * * * *